United States Patent
Davis et al.

(10) Patent No.: US 9,347,973 B2
(45) Date of Patent: May 24, 2016

(54) STRESS CONTROL ASSEMBLY AND METHODS OF MAKING THE SAME

(71) Applicant: Gridview Optical Solutions, LLC, Plano, TX (US)

(72) Inventors: Philip B. Davis, Richardson, TX (US); Edward B. Condon, Murphy, TX (US); Grant E. Kenworthy, Allen, TX (US)

(73) Assignee: Gridview Optical Solutions, LLC, Plano, TX (US)

(*) Notice: Subject to any disclaimer, the term of this patent is extended or adjusted under 35 U.S.C. 154(b) by 189 days.

(21) Appl. No.: 14/278,856

(22) Filed: May 15, 2014

(65) Prior Publication Data

US 2014/0340806 A1 Nov. 20, 2014

Related U.S. Application Data

(60) Provisional application No. 61/823,879, filed on May 15, 2013.

(51) Int. Cl.
*H02H 9/00* (2006.01)
*G01R 15/24* (2006.01)
*G01R 15/14* (2006.01)

(52) U.S. Cl.
CPC ............ *G01R 15/247* (2013.01); *G01R 15/142* (2013.01)

(58) Field of Classification Search
CPC ..... G01R 15/142; G01R 15/247; H02H 9/005
USPC .......................................................... 361/118
See application file for complete search history.

(56) References Cited

U.S. PATENT DOCUMENTS

| 3,515,798 | A | 6/1970 | Sievert |
|---|---|---|---|
| 4,017,652 | A | 4/1977 | Gruber |
| 4,363,842 | A | 12/1982 | Nelson |
| 4,383,131 | A | 5/1983 | Clabburn |
| 4,610,033 | A | 9/1986 | Fox |
| 4,613,727 | A | 9/1986 | Salanki |

(Continued)

FOREIGN PATENT DOCUMENTS

RU 2363024 C1 7/2009

OTHER PUBLICATIONS

International Search Report corresponding to co-pending International Patent Application Serial No. PCT/US2013/027928 Russia Patent Office dated Oct. 18, 2013; (3 pages).

*Primary Examiner* — Thienvu Tran
*Assistant Examiner* — Kevin J Comber
(74) *Attorney, Agent, or Firm* — Steptoe & Johnson LLP

(57) ABSTRACT

A stress control apparatus for managing effects caused by electrical stress in a high voltage environment, and methods of manufacturing the apparatus. A dielectric tube with a central bore coated with a conductive material has an outer conductive coating on a lower section that is grounded. The central bore carries a high voltage potential from a current-carrying conductor. The grounded coating transitions to the exposed outer dielectric surface along a gradually tapered transition. A conductive insert connects to the central bore and forms an electric field in a space between the insert and the grounded coating. When coated with an epoxy and inserted into the central bore, the insert forms a small gap between an outer surface of the insert and part of the central bore, such that there is no zero potential difference in the gap. Any epoxy that oozes out during insertion will collect in the gap.

19 Claims, 13 Drawing Sheets

(56) References Cited

U.S. PATENT DOCUMENTS

| | | | |
|---|---|---|---|
| 4,717,237 | A | 1/1988 | Austin |
| 4,772,090 | A | 9/1988 | Atkins et al. |
| 4,802,731 | A | 2/1989 | Maschek |
| 5,124,634 | A | 6/1992 | Ulmer |
| 5,268,983 | A | 12/1993 | Tatarka |
| 5,455,383 | A | 10/1995 | Tanaka |
| 5,553,173 | A | 9/1996 | Lutz et al. |
| 5,594,827 | A | 1/1997 | Joulie |
| 5,804,630 | A | 9/1998 | Heyer |
| 6,015,625 | A | 1/2000 | Morizono et al. |
| 6,015,629 | A | 1/2000 | Heyer |
| 6,051,796 | A | 4/2000 | Kuhl |
| 6,215,940 | B1 | 4/2001 | Johnson |
| 6,340,794 | B1 | 1/2002 | Wandmacher et al. |
| 6,348,781 | B1 | 2/2002 | Midya |
| 6,348,786 | B1 | 2/2002 | Bjarme et al. |
| 7,373,056 | B2 | 5/2008 | Bohnert et al. |
| 7,683,795 | B2 | 3/2010 | Bjorn |
| 7,880,961 | B1 | 2/2011 | Feve et al. |
| 8,005,324 | B2 | 8/2011 | Bremnes |
| 8,076,925 | B2 | 12/2011 | Harlev et al. |
| 8,774,587 | B1 * | 7/2014 | Davis .................... G02B 6/442 385/135 |
| 2009/0220188 | A1 | 9/2009 | Bremnes |
| 2011/0095749 | A1 * | 4/2011 | Harlev .................. G01R 1/071 324/97 |

* cited by examiner

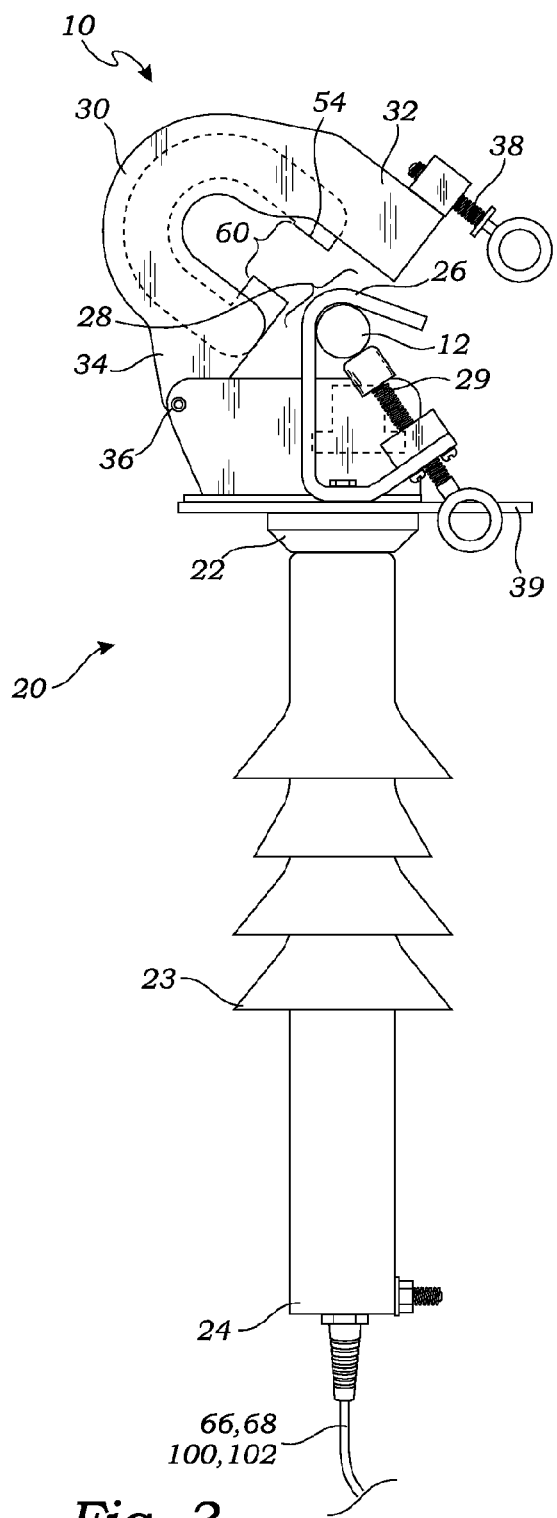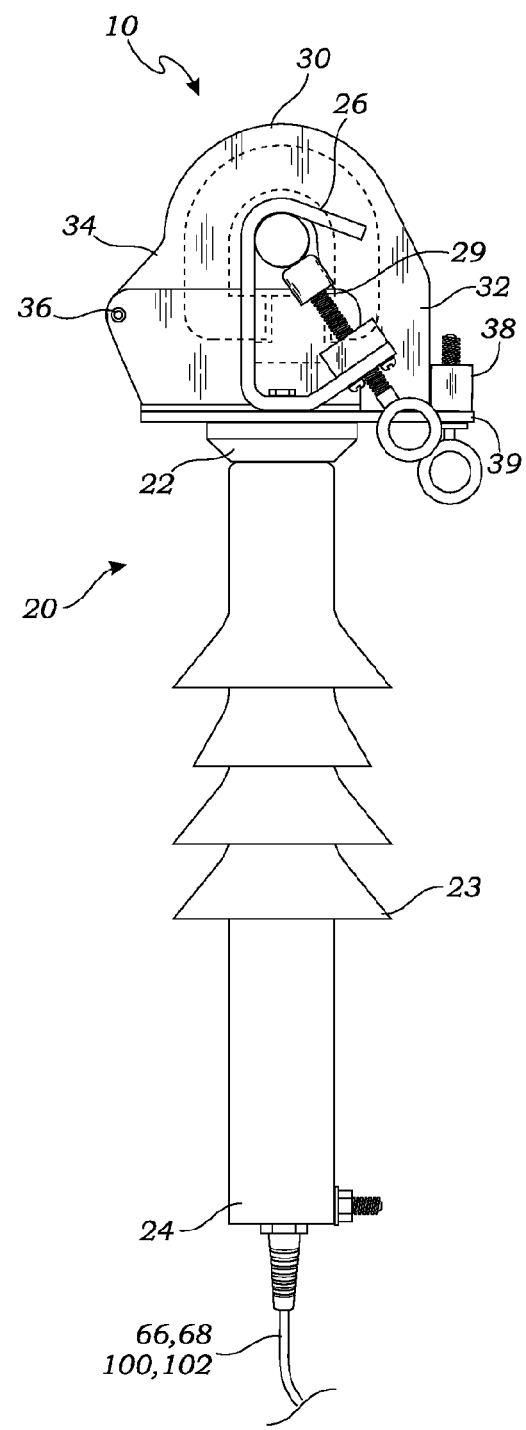
Fig. 3
Fig. 4

STRESS CONTROL ASSEMBLY AND METHODS OF MAKING THE SAME

CROSS-REFERENCE TO RELATED APPLICATIONS

This application claims the benefit of U.S. Provisional Patent Application Ser. No. 61/823,879, filed May 15, 2013, entitled, "Stress Control Assembly and methods of Making the Same", all of which is hereby incorporated by reference herein in its entirety.

FIELD OF THE PRESENT DISCLOSURE

Aspects of the present disclosure relate to stress control assemblies, and more particularly, to stress control assemblies that house an optical voltage sensor that senses a voltage between two potentials.

BACKGROUND

Electrical stress is an undesirable phenomenon that occurs where there is a high electric field in regions at significantly different electric potentials. If not managed or controlled properly, electrical stress can lead to partial discharge, such as in the form of corona discharge, or dielectric breakdown, which causes regions within a dielectric or insulating material to breakdown and not provide the needed insulation properties. Voltage sensors that measure an electric field as a means of determining voltage between a current carrying cable and another potential, such as ground, are placed between conductive structures at the different potentials of interest. To prevent arcing between the current carrying cable and ground, the point of measurement of a high voltage potential can be brought a distance away from the high potential cable along various conductors that can pass through various dielectric structures, including air. The respective rates of expansion and contraction of the conductive and non-conductive structures or mediums are different, which can create a risk of fracture at a conductive-dielectric interface. Areas of high electrical stress are the most vulnerable to these effects. For voltage sensors that measure a voltage between a high voltage potential and ground, examples of such vulnerable areas include where a grounded conductive surface interfaces with a non-grounded conductive surface or where a low dielectric medium or material (e.g., air) abruptly transitions to a high dielectric material or medium.

In addition, to bring a high electric potential to a voltage sensor located a distance away from the current carrying cable, a conductive structure couples the voltage potential from the current carrying cable to an area where the voltage sensor is located. During an extreme electrical fault that exceeds the rated dielectric strength, the conductive structure serves as a low resistance path, allowing the current to create unintended paths by arcing across or through dielectrics or cause thermal breakdown of dielectrics, which can damage the voltage sensor or pose a safety hazard to human operators or other personnel near the conductive structure. The larger the cross sectional area of the conductive structure, the more current it can carry, creating a commensurately greater risk to human safety and equipment integrity.

A need exists for a stress control apparatus that suppresses or eliminates the possibility of partial discharge or dielectric breakdown, safely manages overcurrent conditions or other fault conditions, and avoids other problems to extend the life, accuracy, and integrity of a voltage sensor, and methods of making the same.

BRIEF SUMMARY

According to an aspect of the present disclosure, a stress control apparatus features an elongated dielectric member that carries a high voltage potential and provides a conduit for optical fibers within a metal-plated central bore a distance away from a high voltage cable. A lower portion of the dielectric member has a thin metal coating, which is connected to a ground potential. This grounded metal coating is electrically insulated from the conductive central bore by dielectric material. The central bore, having a very thin plating, isolates the optical fibers from high electric fields as well as operates as a fuse, burning up during an overcurrent fault to prevent electrical current from traveling down the central bore during the fault. The voltage sensor is inserted into an electric field space formed in the lower portion of the dielectric member.

The conductive channel is terminated by a conductive insert that is wedged into a bottom end of the channel until it can be inserted no further. When fully inserted, the conductive insert carries the voltage potential a bit further down the stress control apparatus, such that the electric field space lies between the conductive insert and the grounded plating on the outer surface of the dielectric member. The conductive insert has a shoulder that lies below the end of the channel to form a gap, such that the shoulder and the coated central bore are at the same voltage potential. A conductive adhesive is applied around the conductive insert prior to being inserted into the channel, such that any excess conductive adhesive that may collect in the gap will not cause or contribute to electrical stress because there is zero potential difference within the gap.

On the outer surface of the dielectric member, a gradual, smooth tapered transition is presented that is devoid of any sharp edges. When an outer stress control sleeve is inserted over the dielectric member, the tapered transition helps to prevent any airgaps from forming (or at least minimizing any airgaps) between the sleeve and the boundary where the grounded metal plating transitions into the dielectric material, where electrical stress is very high. The smooth, gradual transition helps to eliminate electrical stress in this transition area.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

FIG. 3 is a side elevation view of FIG. 1 showing the magnetic concentrator in the open position.

FIG. 4 is a side elevation view of FIG. 2, showing the magnetic concentrator in the closed position.

Figure 1:
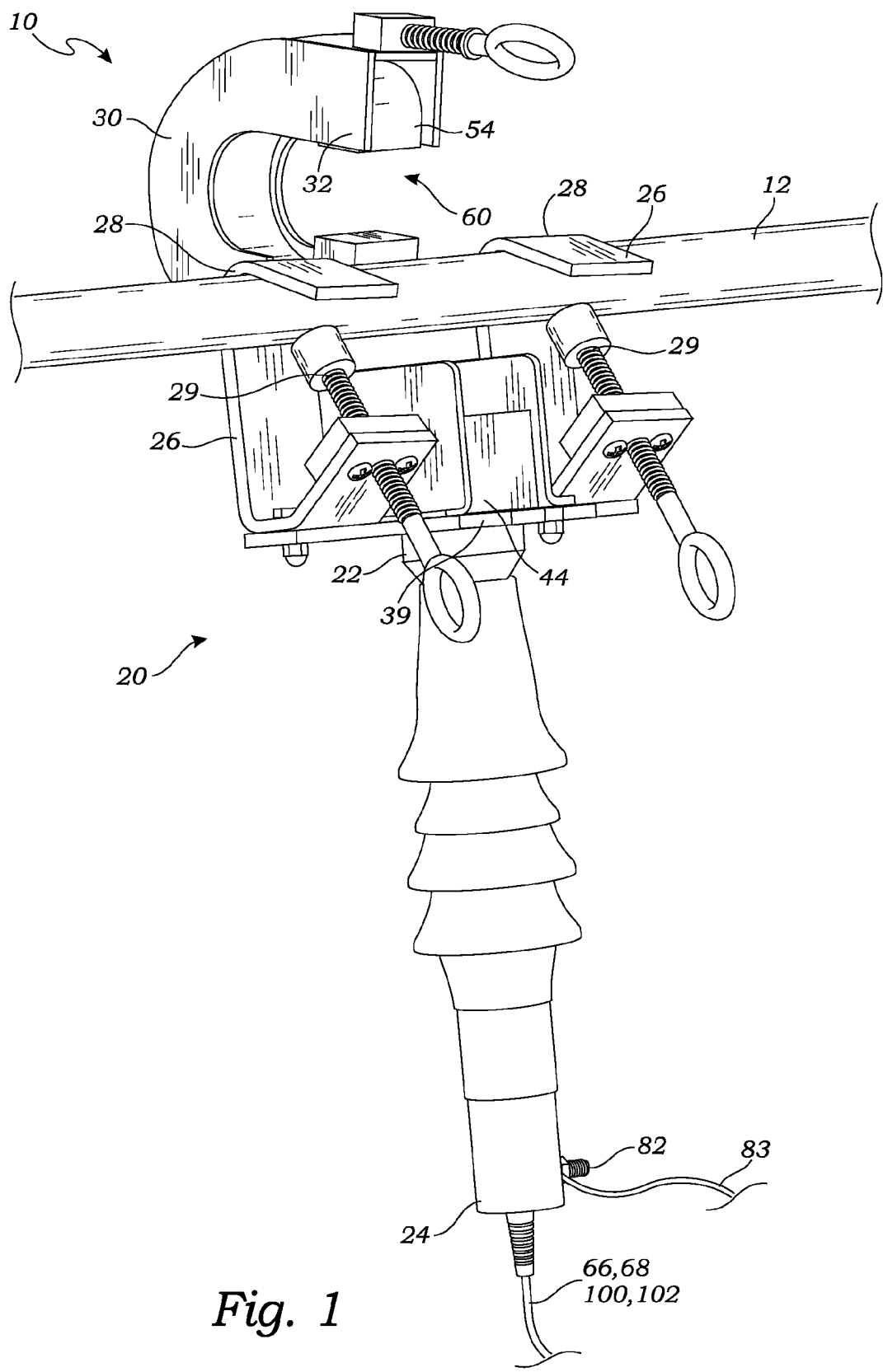
FIG. 1 is a perspective view of an optical sensor assembly when a magnetic concentrator is in open position, according to an aspect of the present disclosure.

While aspects of the present disclosure are susceptible to various modifications and alternative forms, specific embodiments or implementations have been shown by way of example in the drawings and will be described in detail herein. It should be understood, however, that this disclosure is not intended to be limited to the particular forms disclosed. Rather, this disclosure is to cover all modifications, equivalents, and alternatives falling within the spirit and scope of the invention as defined by the appended claims.

DETAILED DESCRIPTION

Figure 2:
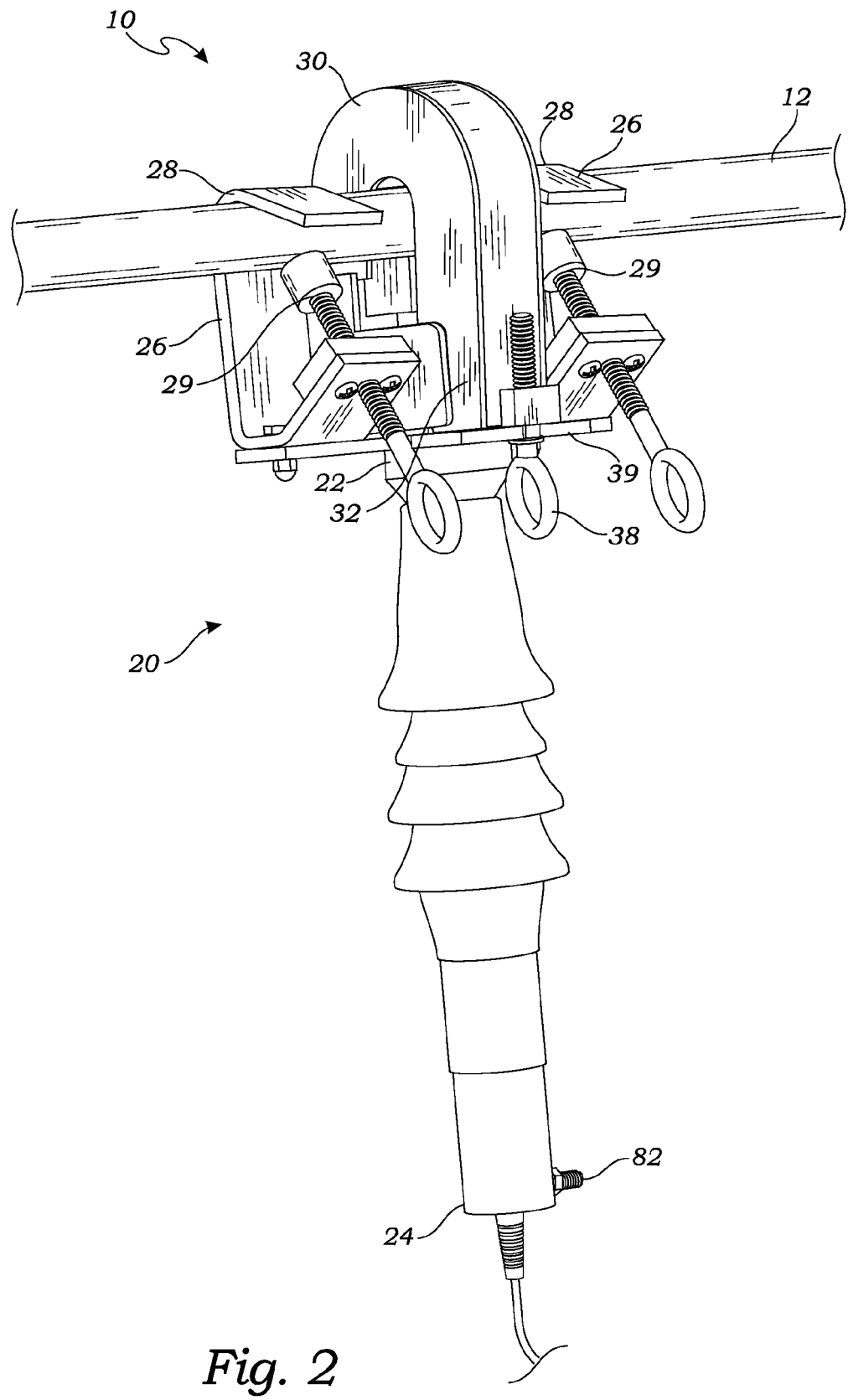
FIG. 2 is a perspective front view of FIG. 1 showing the magnetic concentrator is in a closed position.

FIG. 1 is a perspective view of an aspect of an optical sensor assembly 10 showing a magnetic concentrator 54 in an open position that has not yet been placed in a position to encompass or partially encompass a current carrying cable 12. In this position, the current carrying cable 12 is still firmly held by the optical sensor assembly 10. FIG. 2 is a perspective front view of FIG. 1, showing the magnetic concentrator 54 in a closed position and a housing 30 locked in place by a locking element 38.

Referring to FIGS. 1 and 2, a base unit 20, which extends from hooks 26 to the bottom (relative to earth) of the optical sensor assembly 10, uses two hooks 26, as shown, for hanging the base unit 20 from a current carrying cable or conductor 12. Only one hook, by itself, or, optionally, with ties, strapping or other structures can be used. A pair of hooks 26 are arranged, one on either side of an optical current sensor 44. Each of the hooks 26 can include a curved portion 28 configured to firmly hold the base unit 20 to the current carrying cable 12.

As illustrated in FIGS. 1-4, each hook 26 can further include a clamp 29, such as a screw clamp as illustrated, although other clamps and equivalent fasteners may be used. The words "clamp" and "clamps" are intended to include such alternative constructions which will firmly hold the base unit 20 in fixed position relative to the current carrying cable 12 at least when the housing 30 is closed. The illustrated clamp 29, forces the current carrying cable 12 against the curved portion 28 of the hook 26 to secure the base unit 20 to the current carrying cable 12, so that the assembly remains physically stable relative to the cable even in rough weather conditions.

The "current" in a power distribution cable or conductor, (and even in other current carrying wires or cables), can be comprised of a plurality of components having a myriad of amplitudes and frequencies, as well as direct currents, (DC). As used herein, "current" is intended to comprehend a "single current" (that is, a current of singular amplitude and singular frequency and, also, DC current), and, as well, "a current having a plurality of component current frequencies or amplitudes, or both, as well as, DC." The terms cable and conductor are synonymous, and a cable can be insulated or non-insulated.

Figure 5:
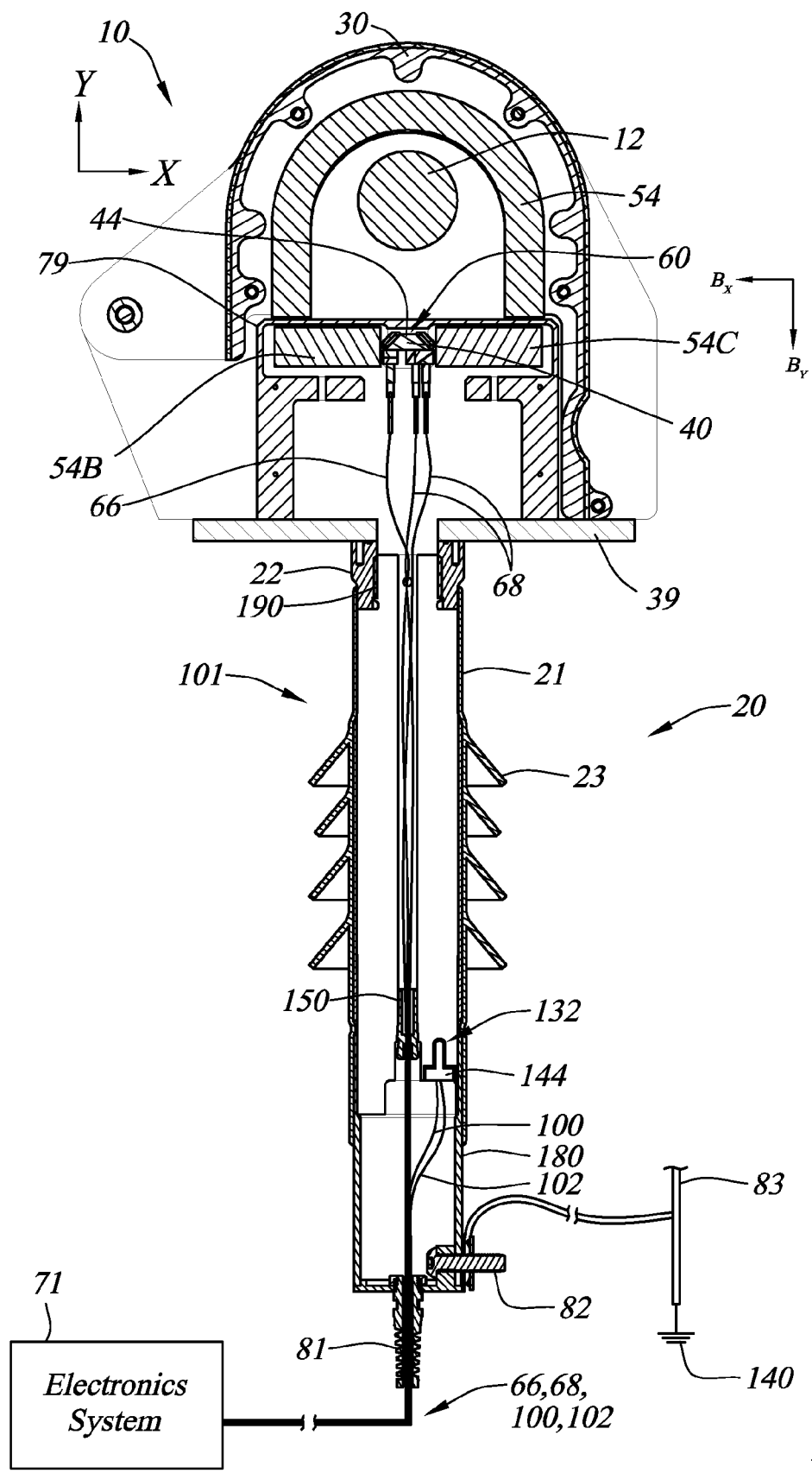
FIG. 5 is a side elevation, cross-section view of a powder core magnetic concentrator, closed, as in FIGS. 2 and 4, in relation to the cable and the current sensor. The magnetic concentrator further illustrates the airgap in the magnetic concentrator, according to an aspect of the present disclosure.

When the optical sensor assembly 10 is hung on the current carrying cable 12, the optical sensor assembly 10 is held firmly to the cable 12 regardless of whether the magnetic concentrator 54 is open or closed. The cable 12 can be held in a fixed position relative to the body of the optical sensor assembly 10, as shown, or, alternatively, with the clamps 29 held in a fixed position with respect to the movable magnetic concentrator 54. In a closed, operating position, the magnetic concentrator 54 encircles the cable 12 or a sufficient amount thereof so as to pick up the magnetic field induced by the current flowing through the cable 12 and extend the magnetic field to the magnetic concentrator's airgap 60 in which the optical current sensor 40 is disposed when in an operating position. FIG. 5 shows the optical current sensor 40 positioned within the airgap 60. Further, the magnetic field provided by the magnetic concentrator 54 is strong enough to exclude stray, undesired magnetic fields, or else, suitable means against them can be provided.

Among the alternatives to hooks, clamps, fasteners and the like, for holding the current-carrying cable, it is to be appreciated that plastic ties, wires, ropes, chains, and all sorts of means may be devised for firmly holding the current-carrying cable with respect to the optical sensor assembly. "Clamps" is intended to cover all sorts of hooks, fasteners, jaws, wedges, vices and other devices adapted or adaptable to the firmly holding of the cable 12.

A concentrator housing 30 is pivotally attached at the top of the optical sensor assembly 10 and partially encloses the magnetic concentrator 54 and, when in operation, holds it around the current carrying cable 12. The concentrator housing 30 has a first end 32 and a second end 34, illustrated in FIGS. 3 and 4. By also referring to FIGS. 3 and 4, it can be seen that a pivot 36 of the second end 34 of the concentrator housing 30 pivotally attaches the concentrator housing 30 such that the concentrator housing 30 moves both itself and the magnetic concentrator 54 between an open position and a closed position. Other constructions are contemplated to properly position the magnetic concentrator 54 around the current carrying cable 12, at least during operation of the optical sensor assembly 10.

The structure holding the cable 12, magnetic concentrator 54, and other elements of the optical sensor assembly 10, is rigidly designed to minimize vibrations that cause erratic readings in the system. It is to be appreciated that, in operation, the cable 12 is fixedly held, either with respect to the body of the optical sensor assembly 10, or fixed with respect to the magnetic concentrator 54, whether the magnetic concentrator 54 is open or closed. For example, the cable 12 is fixedly held with respect to the body of the optical sensor assembly 10, rather than to the magnetic concentrator 54.

FIGS. 3 and 4 are side elevations of the optical sensor assembly 10. Referring to FIGS. 3 and 4, in the open position shown FIG. 3, the concentrator housing 30 is moved away from the base unit 20. In FIG. 4, showing the closed position, the concentrator housing 30 positions the magnetic concentrator 54 around the current carrying cable 12 such that the current carrying cable 12 passes through the airgap 60 to the interior of the magnetic concentrator 54 without physically touching the magnetic concentrator 54 or the concentrator housing 30. Other constructions are contemplated in which the cable 12 does not pass through the airgap 60.

A locking element 38 is provided for removably securing the first end 32 of the concentrator housing 30 to the base unit 20 in the closed position. In the illustrated example, the locking element 38 is a screw-type clamp attached to the concentrator housing 30 that removably engages a flange 39 of the base unit 20. The locking element 38 locks the concentrator housing 30 in the closed position, thereby maintaining the magnetic concentrator 54 in its position, which creates a magnetic field around an optical current sensor 40 (not shown) that lies within, or in some aspects, partially within, the airgap 60 of the magnetic concentrator 54.

The portion of base unit 20, from the flange 39 downward (toward earth), is encased in a high-dielectric insulator 21, having outer flanges, such as a flange 23, which substantially increase the external electric arcing path on the outer surface of the base unit 20. Those skilled in the art know what material or combinations of materials can be used, such as, but not limited to, a high dielectric elastomer, rubber, silicon rubber or various other materials. Such outer coverings, or sleeves, are commercially available and can be stretched, form-fitted, previously molded or cold or heated, shrink-fitted to the body of the insulated device. Other suitable outer surface layers can be utilized having high dielectric insulation, suitable by having high voltage breakdown, weathering and temperature withstanding characteristics.

FIG. 5 is a side elevation, cross-section view of the magnetic concentrator 54, in relation to the current carrying cable 12 and the optical current sensor 40. As illustrated in FIG. 5, the optical current sensor 40 includes a polarized light input 42 and a light directing device, which in this example is a reflective prism 44. The polarized light input 42 is operably connected to receive and polarize the light beam from a light source 48, which can be by way of example, but not limited to, a LED or a laser, and the light output 46 is operably connected to provide a light output to a light analyzer in the electronics system 71. Polarized light is directed into the reflective prism 44 as a polarized light beam. In the reflective prism 44, the portion of the polarized light beam, parallel to the magnetic field, $B_x$, is rotated in its polarization by being exposed to the magnetic field. The rotated, polarized beam of light is reflected out the light output 46, and to the light analyzer in the electronics system 71 that senses this rotation, which represents the current magnitude, (and many other characteristics of the current), and the current direction in the cable 12.

Light detectors, as part of the light analyzer, but in this example are located remotely in an electronics system 71, convert the output polarized, rotated light signals from the optical current sensor 40 in one or more output optical fibers 68 into corresponding electrical signals so that they can be analyzed and evaluated by the electronics system 71.

In the discussion herein, the words "optical," "optics," "electro-optical" and the like are used for brevity and clarity. However, it is intended that those terms, as used herein, are intended to cover frequencies of electromagnetic radiation not only inside the visible spectrum, but also frequencies outside the visible spectrum. Such meanings are commonly accepted by those of ordinary skill in the art to which the present disclosure pertains. Also, it is commonly understood by those skilled in the electro-optical art that "light" and "polarized light" include both frequencies inside and outside of the visible spectrum. Suitable examples of "light" outside the visible spectrum include infrared and ultraviolet frequencies. Of course, the selected frequency or frequencies are those, preferably, for convenience, economics and reliability for which there are suitable electrical components available as to sources, conductors, transmitters, detectors, and so forth. Near infrared frequencies, say, for example, but not with limitation, 800 nm to 900 nm are well-suited for meeting the requirements for application to the optical sensor assembly 10 described herein and also for which there are suitable electrical components readily available. Infrared frequencies, particularly, the near infrared, are those commonly used in similar optical devices and are suited for use herein.

Examples of a suitable optical current sensor that can be used as the optical current sensor 40 herein are disclosed in co-pending U.S. Provisional Patent Application No. 61/823,849, filed on May 15, 2013, entitled "Electro-Optic Current Sensor With High Dynamic Range and Accuracy," and U.S. patent application Ser. No. 13/553,486, filed Jul. 19, 2012, entitled "Optical Sensor Assembly For Installation on a Current Carrying Cable."

Referring still to FIG. 5, the magnetic concentrator 54 has a gap that defines an airgap 60. The magnetic concentrator 54 is mounted, within a housing 30 that is pivoted, (not shown), so that it fits around the current carrying cable 12 when the base unit 20 is hung from the current carrying cable 12 by the at least one hook 26. When the concentrator housing 30 is moved to the closed position, the reflective prism 44 is operably positioned in the airgap 60 of the magnetic concentrator 54.

The distance between the magnetic concentrator 54 and the current carrying cable 12 is adjusted so that magnetic concentrator 54 creates an optimum magnetic output, or, at least, a suitable output so that a magnetic flux density ($B_x$) is present in the airgap so that parameters of the optical current sensor, including the optical path length (the distance across the airgap), and the Verdet constant of the glass material (e.g., of the prism 44) across the airgap are optimized for sensing the current flowing through the cable 12.

The path of the beam within the light directing device, such as the prism 44, can be closely aligned with the lines of force of the magnetic field. If this is done, a more precise, rotated output and, consequently, more precise corresponding electrical signals can be generated therefrom. Depending on the current sensor 40, and, particularly the light directing device, such as prism 44, other angular alignments are contemplated.

The light directing device, which, in FIG. 5 is a reflective prism 44, can have any shape, prism or otherwise, that directs the light from a polarized light input to a light output. In the illustrated example, the reflective prism 44 is a prism having a pair of sloped reflective surfaces for directing the beam as described above. Glass provides benefits such as low temperature sensitivity. Other materials and shapes of reflective prism 44, its reflective surfaces and fiber optics configuration can alternatively be used. Some of such possibilities are disclosed in co-pending U.S. Provisional Patent Application No. 61/823,849, filed on May 15, 2013, entitled "Electro-Optic Current Sensor With High Dynamic Range and Accuracy."

The light directing device can be a material selected from the group of near optical grade glass, or better, bulk glass, diamagnetic glasses, crystals, including, particularly, ferromagnetic crystals, polymers, doped polymers and other materials, having polarized light directing properties and susceptible to the Faraday effect upon such polarized light, and having minimal temperature sensitivity or having a temperature sensitivity that can be suitably corrected or compensated for.

Many optical grades of glass or near optical grade and other bulk glass items are well-suited for a light directing device, including for a reflective prism. Some of the most sensitive materials of this kind are diamagnetic glasses and magnetic crystals.

Other glasses, crystals, polymers, doped polymers and various other materials, mixtures and compounds are also suitable, provided they conduct polarized light, are susceptible to the Faraday effect for a suitable range of current causing a rotation of the polarized light, and have minimal temperature sensitivity, or a temperature sensitivity that can be corrected, compensated for, calibrated for or otherwise accounted for. They should also have a suitable frequency response to provide information suitable for analysis and evaluation of one or more of spectral content, harmonics, stray frequencies, and other factors in determining quality.

Glass, crystal or other materials can be found used for the light directing device herein, if they are transmissive of polarized light beams, electro-optically sensitive to the Faraday effect, capable of sensing a wide bandwidth of magnetic frequencies, have a wide range of response to magnetic fields and have no deficiencies, including temperature sensitivity or other deficiency, that cannot be corrected for, by monitoring, or by "look-up" tables or mathematical formulas in a computing device or by other means.

From any such light directing device the optical sensor assembly 10 combined with the electronics system 71 can provide the capability for determining current quality, which is hereby defined as including one or more of identification, measurement, display and indication, analysis, evaluation and reporting of one or more of current levels, spectral content, harmonics, transients, impedance, faults, fault locations, surges, spikes and power factor and any other characteristics of value or of interest.

Determination of impedance depends on a measured voltage between the potential of the current carrying cable 12 and another reference potential, such as ground 140, and power factor can be determined by having the locations or points of the zero crossings in the measured voltage signal (i.e., where the alternating voltage waveform crosses zero volts).

The beam of polarized light 52, at some intermediate length within the reflective prism 44, can be closely aligned to be parallel with the magnetic field in the airgap 60. The magnetic field in the airgap 60 rotates the plane of polarization of the polarized light 52 within the reflective prism 44. This is also sometimes referred to as a "shift" between polarized light components. The amount of rotation is proportional to the strength of the magnetic field in the airgap 60 and the amount of rotation is measurable by a light analyzer in the electronics system 71 to determine a characteristic (e.g., magnitude) of the current flowing through the current carrying cable 12.

In FIG. 5, the optical current sensor 40 is positioned within the airgap 60 formed between two opposing magnetic concentrator segments 54B and 54C of the magnetic concentrator 54. Current carrying cable 12 is shown within the central portion of magnetic concentrator 54. The magnetic field of the magnetic concentrator 54A is carried through aluminum panel 79, (which lies between the upper part of the core 54 and the lower magnetic segments 54B and 54C, and is part of a larger structure enclosing items lying below magnetic concentrator 54). The magnetic field extends through the aluminum panel 79 into the magnetic segments 54B and 54C, which create a magnetic field in the airgap 60 that lies between them. The light directing device, in this instance, a prism 44, is located within that airgap 60 and receives a beam of polarized light from a polarizer. Such polarized beam of light is then further rotated within prism 44, (in accordance with the magnetic field, $B_x$, which is created by the magnetic concentrator 54 from current in the cable 12), by Faraday effect, thus, providing much output information (e.g., magnitude) concerning the current in cable 12, as polarized light to a polarizing beamsplitter from which two polarized light beams are provided to optical fiber light connections that are coupled to one or more output optical fibers 68.

In the example shown in FIG. 5, the magnetic concentrator 54 has a powder core composed of a magnetic powder mixed with at least one type of non-magnetic material and having miniature distributed airgaps throughout the magnetic concentrator 54. A powder magnetic core having high saturation level and a narrow hysteresis loop, (to reduce the power loss), can be utilized herein.

One or more output optical fibers, generally designated by reference number 68, connect to receive one or more output polarized, rotated light beams from a polarizing beamsplitter through corresponding fiber light connections without any optical sensor or amplifier. Alternately, an optical sensor or amplifier can be used, but in this example, nothing but simple optical fiber light connections connect the one or more output optical fibers 68 to receive the output(s) of a polarizing beamsplitter in the optical current sensor 40.

The one or more output optical fibers 68 carry the output light beams (which are rotated, polarized light beams) to be converted into corresponding electrical signals by light detectors at the input of the electronics system 71. Such output information in the one or more optical fibers 68 because of the dynamic characteristics and ability of the magnetic concentrator 54 and great sensitivity and dynamic ability of electro-optical light directing devices, such as the prism 44, includes a myriad of information concerning the current quality, including, but not limited to, current level, spectral content, harmonics, stray frequencies, transients, surges and spikes. Impedance and power factor can also be determined if voltage information is available.

Due to saturation, magnetic concentrators, which readily saturate, have a limited dynamic range of current sensing. An electric utility company has various requirements for the dynamic range of current to be measured, depending on the application. For example, a normal operating range can extend from at least as low as approximately 5 amperes to about 600 amperes and fault ranges of 10 times the normal operating range and, even, up to about 40 times the normal operating range. At those ranges, a ratio, or scaling, is required. Optical current sensing together with detection (changing "light" to electrical signals) provides ready ratio conversion, which is easily changed to another ratio, as necessary. The industry has agreed that a current ratio of about 100 amperes to 1 volt can generally be used, for normal operating range, which would allow 1000 amperes to be measured without distortion. However, for fault detection, a greater current ratio, say, 1000 amperes to 1 volt, measured in real time, would be required. Of course, rather than trying to fit excessive current into a range measurement system, a simple detector indicator can be used to determine and indicate when the current has exceeded 1000 amperes. Some other selected excessive value may be used as a maximum if required. This information can be provided, simply, when current exceeds the values within the normal current range or ranges.

On the other hand, scaling can, in effect, be determined by a system that has a wide current sensing capability and the electronics system 71, such as a computing device, which utilizes the data pertaining to the current range of interest and discards or ignores measurements outside that range of interest.

Wide ranges of core material are available and are commonly used for magnetic fields. Iron by itself, of course, has high permeability, but saturates at too low of a current level to be used for a wide range of sensing and measuring.

A high saturation level is achieved by the magnetic concentrator 54, thanks to a compressed powder core having magnetic particles dielectrically insulated from each other in a dielectric matrix and minute airgaps distributed within the powder core. The powder core can be comprised of various magnetic powders. Some of such powders include iron-containing particles, silicon iron-containing particles, silicon steel-containing particles, and other mixtures, alloys, and compounds of iron and steel. Other magnetic materials can also be found useful in suitably raising the saturation level of the magnetic core twice and, even to as many as ten times, the normal current level of the system.

For lower current measuring, higher permeability cores are used and for higher current measuring, lower permeability cores are used. Suitable magnetic cores can also be constructed, for example, of laminations of silicon steel held together by one or both of an adhesive or an epoxy, or other suitable matrix. Smaller, narrower, lamination strips are useful for efficiency at higher frequencies of current detection and larger, wider lamination strips are useful for lower frequencies of current detection. Laminations made of powdered core materials are also useful.

Narrow hysteresis curves in the magnetic concentrator are desirable and will substantially reduce the power losses and the measurements will be more linear, leading to more accurate measurements.

The magnetic concentrator 54 is easily clamped onto existing cables 12 without cutting the cables 12 (note, typically, high voltage current-carrying cables in above-earth, medium- to high-voltage distribution systems are not insulated), and provides a very high dynamic range. The magnetic concentrator 54 can be of any shape that functions to provide the necessary magnetic field to an airgap, such as the airgap 60, within which an optical current sensor, such as the optical current sensor 40, can be placed.

By properly selecting the magnetic concentrator 54 and adapting the electronics 71, the sensors 40 can be used for multiple applications. For example, assume a 600 ampere nominal current sensor 40 is capable of measurement of very high momentary fault current (e.g., approximately equal to or greater than 5,000 amperes). The electronics 71 are fast, high in bandwidth, but lower in gain and accuracy at that level. For current less than 1 ampere it is desired to measure at a lower bandwidth for several reasons. A normal harmonic content should be less than 5% and 5% of 1:600 ampere is negligible (0.000083 ampere) for metering and for quality of power. Therefore, a bandwidth of about 200 Hz is acceptable at this current. Current state of electronics allows dynamic adjustment of the gain and the bandwidth. The electronics system 71 disclosed is capable of filtering, through the use of filters or by computer data processing and, thus, is able to provide information down to 0.1 Hz.

The lower limit is the noise floor of the signal being processed, which is determined mostly by the source of the beam(s) and of the electronics, and the higher limit is the current at, or just below, saturation of the magnetic concentrator 54 and the power supply levels of the electronics.

Figure 7:
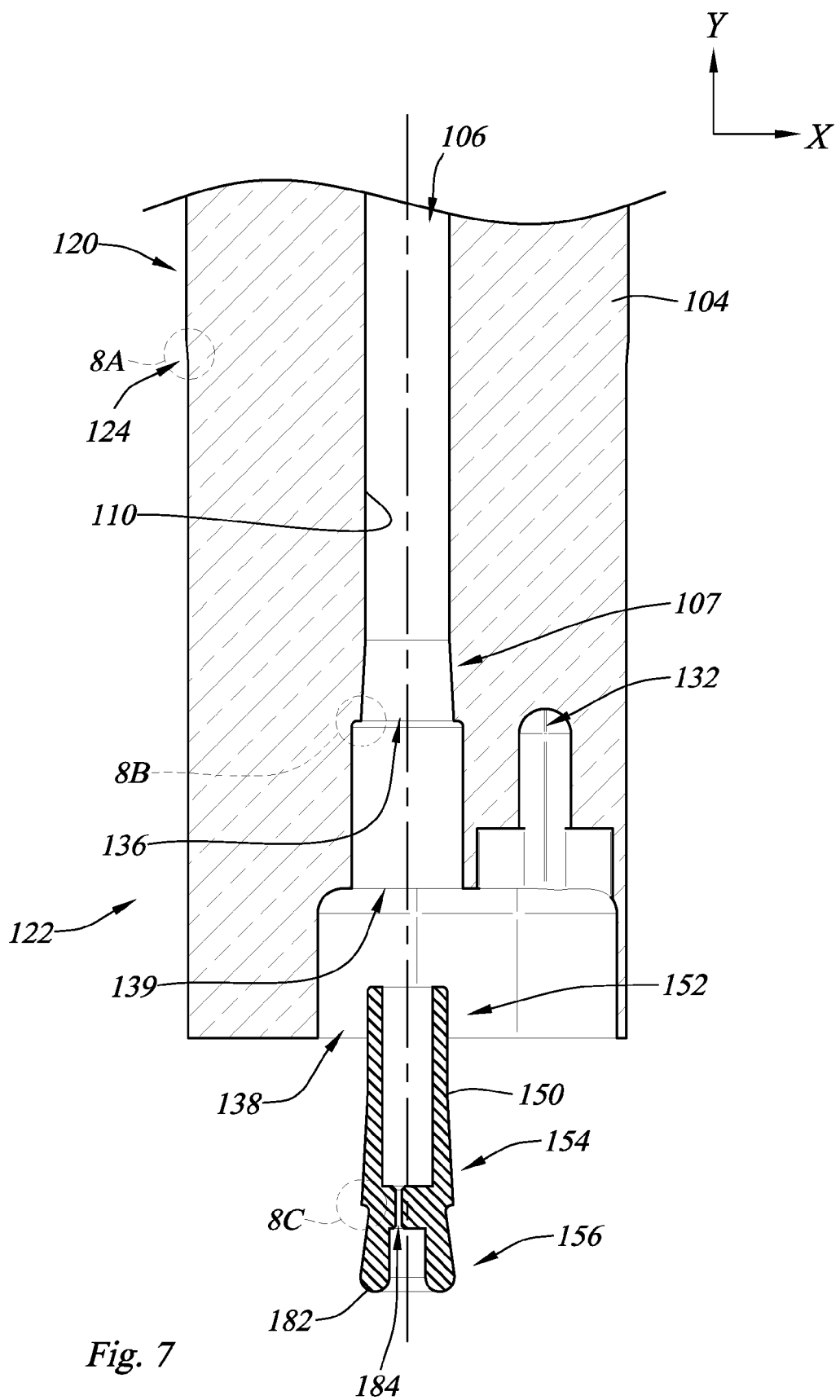
FIG. 7 is a partial side view of part of the stress control apparatus shown in FIG. 6, showing the conductive insert positioned to be inserted into the channel adjacent to an electric field space. Three areas labeled 8A, 8B, and 8C are enlarged and shown in FIGS. 8A, 8B, and 8C, respectively.

For a voltage sensor 144 (FIG. 5), an input optical fiber 100 supplies an input light beam, from a LED or laser, (which components are well-known in the art), to a voltage sensor area (shown as an electric field space 132 in FIG. 7, in which an electric field commensurate with a voltage potential difference is present). The voltage sensor 144, for example, can be sensitive to the Pockels effect inside the electric field space 132, and can be used in conjunction with the current sensor 40. One or more output optical cables 102 provide the outputs from the voltage sensor 144 placed in the electric field space 132, and are coupled to the electronics system 71 for converting into one or more characteristics (e.g., magnitude) of voltage, including impedance, power fact, and other characteristics ascertainable from voltage measurements.

Thus, by the use of optical fibers 66, 68, 100, 102, the electronics components in the electronics system 71 can be located remotely (a safe distance away) from the high voltage, current-carrying cable 12, such that deteriorating effects of high voltage transients, lightning, and other weathering conditions on the electronics parts can be reduced, suppressed, or eliminated.

If a laser is used as the light source 48, the light beam produced by the laser will likely need to be depolarized and then collimated in order to be suitably polarized at the input to the light directing device, prism 44. If a LED is used as the light source 48, the light beam produced will need to be collimated in order to be suitably polarized at the input to the light directing device, prism 44. Of course, other suitable light-emitting devices can be used instead.

From the standpoint of overall management of an electrical distribution system, its safety, efficiency, reliability, and economics, determining the quality of current is of prime importance. Current quality includes determination of one more factors of current level, spectral content, harmonics, transients, impedance, surges and spikes and power factor. Determination of impedance and power factor would require some information as to voltage, including timestamps where the zero crossings occur in the measured alternating voltage signal.

Computing devices (computers, digital signal processors, microprocessors, and the like) in the electronic system 71, receiving information through the output optical fiber cables 68, 102 from the current sensor 40 and the voltage sensor 144, respectively, provide an evaluation and mathematical analysis to determine such quality factors from electrical signals representative of the measured current and the measured voltage, such as impedance and power factor. From the measured voltage, the electronics 71 can analyze harmonics, transients, spikes and voltage anomalies in the electrical distribution system in which the cable 12 is installed. For example, to assess power quality, the electronics 71 measures or calculates harmonics and other frequency components in the measured current, so higher bandwidths, such as 45 Hz to 6000 Hz can be used.

So-called smart grids deliver electricity from suppliers to consumers using digital measuring and monitoring technology to save energy, reduce cost, and increase reliability and transparency of grid conditions. With such smart grids, utilities and industrials require that the same sensor be used for multiple ranges and purposes. Programmable gain amplifiers and variable filters controlled by a computer and frequency analysis within the computer itself, as taught herein, can optimize the information provided by the optical current sensor 40, as to current level, spectral content, harmonics transients, faults and other quality of power factors and analyze, evaluate and otherwise process and provide such information.

Returning to FIG. 5, a collar-like top end or metal cap 22 of a lower base unit 20 lies under the flange 39. The flange 39 and the top end 22 are electrically connected together and are electrically conductive of the voltage potential on the cable 12 when the optical sensor assembly 10 is clamped to such cable 12. The clamp 29, which is adjustable by locking element 38, is shown clamped on the cable 12 in FIGS. 2 and 4, holding it firmly with respect to the optical sensor assembly 10. There are two of such clamps 29, one on each side of housing 30.

At the bottom of the optical sensor assembly 10 is a pass-through connector 81, through which the input and output optical fibers 66, 68, 100, 102, and any other necessary or desirable light or electrical conductors pass and exit (or enter) the lower base unit 20. A ground stud 82 is also shown in FIG. 5 connected to an optional ground pole 83, which in turn is connected to a ground potential 140 (e.g., earth).

Figure 6:
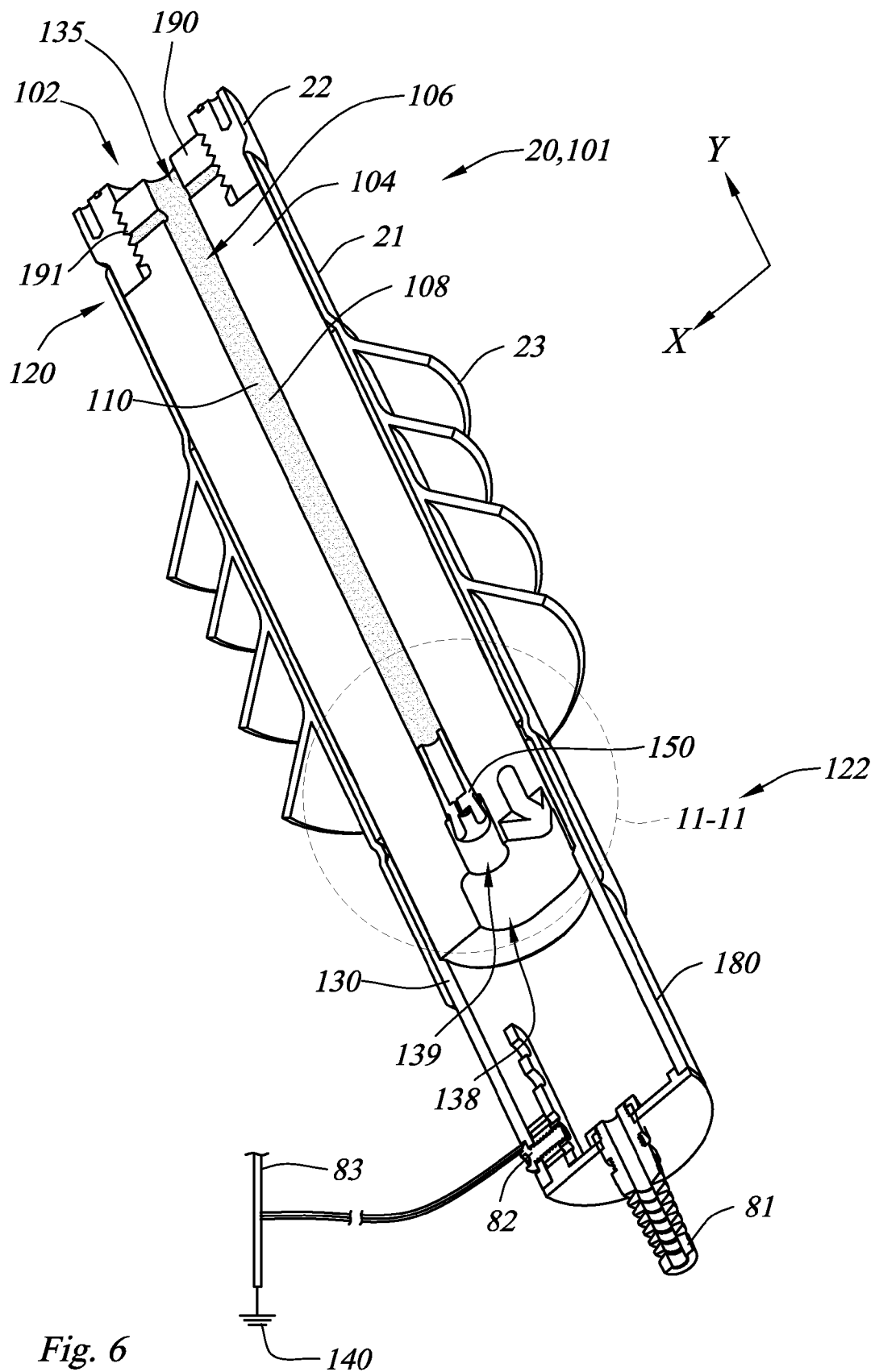
FIG. 6 is an isometric, cut-away view of a stress control apparatus shown in FIG. 5, revealing a conductive channel that is terminated by a conductive insert inserted into the channel. An area 11-11 is enlarged and shown in FIG. 11.

As shown in FIG. 6, a conductive channel 104 is electrically attached to the collar-like, top end 22, which is likewise conductive and which, in turn, is connected to an electrically conductive flange 39, which is connected electrically to the current carrying cable 12. Of course, other connections can be used to electrify the conductive channel 104. The top end or metal cap 22 is screwed onto a threaded flange 190 (shown in FIGS. 5, 6, and 13F), which is electrically connected to the conductive channel 106. The threaded flange 190 has a metal conductive coating or plating 191 (seen in FIGS. 6 and 13F) that is electrically connected to the conductive channel 104. At the bottom, a ground sleeve 180 is attached to the lower portion 122.

The conductive channel 104, which in the illustrated example is generally tubular, protects the optical fiber cables 66, 68 running therethrough from high electrical e-fields and the associated stresses.

Silicone gel is one of many suitable dielectric sealants known to those skilled in the art for use in high-voltage equipment. The sealants are applied to avoid voltage breakdown. Wherever there is a high voltage gradient such high voltage sealants can be used to prevent short-circuit breakdown.

An input optical fiber 66 is provided by a light source located in the electronics system 71. An input optical fiber 100 provides a beam of light from a light source in the electronics system 71 to a voltage sensor 144 in the electric field space 132. One or more output optical fibers 102 provide light information as to the output of a voltage sensor to the electronics system 71, for processing, including conversion to a corresponding characteristic (e.g., magnitude) of voltage.

The electronics system 71 can include a light source (not shown), which can optionally be a polarized light source. The light source provides a beam of light, (such as in or near the near infrared frequencies, but not necessarily so), to the input optical fiber 66, which transmits the light beam to the current sensor 40, shown in FIG. 5. Such a light source, or an additional light source, can provide an incoming beam of light for the voltage sensor 144, via the input optical fiber 100.

The electronic system 71 can be interfaced through analog or digital outputs. For example, the analog output can be a low energy output. For example, a ratio of 10,000:1 can be used for voltage. Thus, for example, 7200 volts (relative to the ground potential 140) on the high-voltage current carrying cable 12 can be represented by 0.72 volts using this exemplary ratio. Other ratios can be used instead. A measured current can also be represented by a voltage signal. For example, 500 amperes through the current-carrying cable 12 can be represented by 1 volt in the electronics system 71, which is scaled and converted to the actual current magnitude of 500 amperes.

There may be cases in which the optical sensor assembly 10 can be used for more than one application. For example, the assembly 10 can simultaneously be used for fault location together with regulating the quality of power. If necessary or desirable, more than one channel of analog to digital conversion may be used. The analog to digital conversion can be done by more than one analog to digital converters or a multichannel analog to digital converter. This "multi-channel gain" approach can also be implemented by software instead of hardware.

When legacy equipment is interfaced with the current and/or voltage sensors 40, 144, such as revenue meters or old relays, power amplifiers can be added (to mimic instrument transformers) to the analog output. A typical voltage to a meter in the United States is 120 volts, so a ratio of 60:1 will provide 120 volts when the cable 12 has 7200 volts (relative to ground). Other voltages up to 1,000 volts are available. A voltage to current amplifier may be connected to the analog output; for example, a 600:5 ampere ratio is typical in the United States. For more modern smart grid applications, a digital output can be used, such as formatted according to RS-232 and/or an Ethernet standard (wired or wireless).

Referring now to FIG. 6, a stress control apparatus 101 includes a base assembly 102a having an elongated dielectric member 104, which provides rigidity and dielectric soundness to the stress control apparatus 101. The base assembly 102a includes a channel 106 extending lengthwise through the dielectric member 104. The channel 106 has a top opening 135 at one end and a bottom opening 136 (shown in FIG. 7) at the other end. The top opening 135 opens away from a top-most surface of the dielectric member 104, and a bottom cavity 138 of the base assembly 102a opens away from a bottommost surface of the dielectric member 104. The terms "top" and "bottom" as used herein do not necessarily refer to any particular orientation relative to earth, but rather are used to differentiate the two openings 135, 136 of the channel 106. In the illustrated examples, the top opening 135 of the channel 160 opens toward the current carrying cable 12, whereas the bottom opening 136 opens in the opposite direction toward earth.

In an aspect of the present disclosure, an electrically conductive coating (or plating) 108 completely covers an inner surface 110 of the channel 106. However, in other aspects, any suitable conductive means of bringing the potential from the cable 12 down the length of the dielectric member 104 is contemplated and can be utilized. In the illustrated example shown in FIG. 6, the conductive coating 108 is electrically connected to a high voltage potential on the high voltage potential cable 12. Advantageously, the conductive coating 108 can be very thin, and when an overcurrent fault exists on the current carrying cable 12, the coating will quickly burn up, like a fuse, due to its small cross-sectional area, thereby creating instantaneous electrical isolation between the high potential of the cable 12 and the ground potential 140, thereby stopping any current flow down the channel 106. The conductive coating 108 (or more generally, the channel 106) operates to carry the potential from the high voltage current carrying cable 12 down the base assembly 102a to the electric field space 132 (shown in FIG. 7), so a very thin coating or plating, such as applied by a conductive paint or a conductive plating or bonding (by chemical, heating, applying, for example) technique or by a selective plating or masking technique, suffices, and is bonded or applied or affixed to or disposed onto the inner surface 110 of the channel 106. Moreover, the conductive coating 108 can bond or be bonded or affixed or applied to the dielectric member 104 with a sufficient strength to avoid tearing or cracking of the conductive coating 108 during expansion and contraction at different rates of the dielectric and conductive parts of the base assembly 102*a*. The channel 106 also provides a conduit for the optical fibers 66, 68 coupled to the optical current sensor 40 to pass, thereby protecting the fibers 66, 68 from high electrical fields and associated electrical stress as they traverse the channel 106 and exit out of the base assembly 102*a* through the pass-through connector 81.

Figure 11:
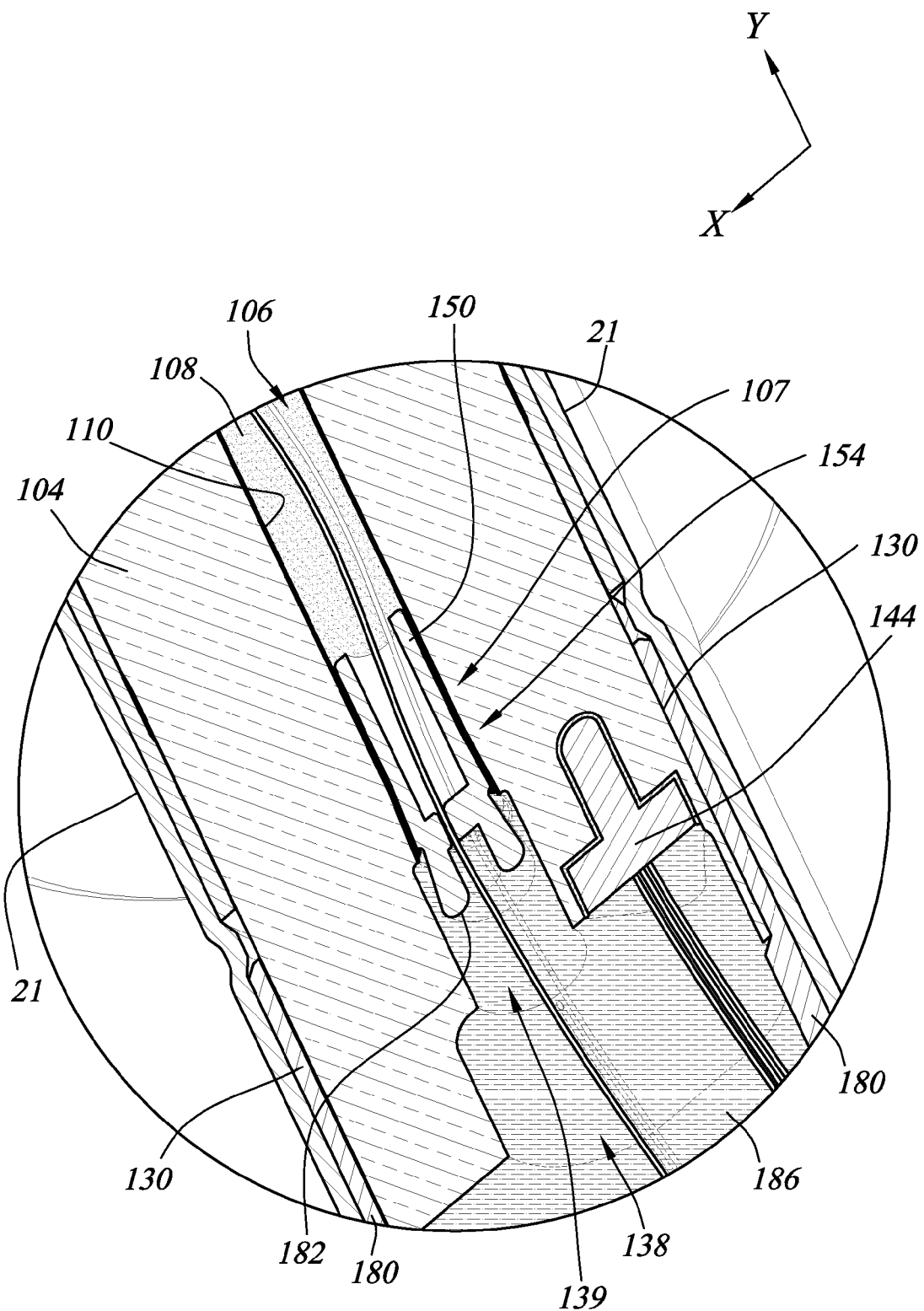
FIG. 11 is an enlarged view of the area 11-11 shown in FIG. 6, showing an isometric, cut-away view of a lower portion of the stress control apparatus, with the conductive insert fully inserted into the channel, a voltage sensor inserted into the electric field space, and representative optical fibers extending away from both.

The dielectric member 104 has an upper portion 120 that transitions to a lower portion 122 at a transition area 124 (shown in FIG. 7) to form a tapered transition. The term "portion" herein is synonymous with a section or an area or a part of the dielectric member 104, which can be of a unitary construction. What separates the lower portion 122 from the upper portion 120 is the transition area 124 between them, as explained below, in the form of a tapered transition. The lower portion 122 has a smaller overall cross section than the cross section of the upper portion at the transition area 124. The upper portion 120 transitions to the lower portion 122 in the transition area 124 along a smooth or gentle taper 126 devoid of sharp edges. The lower portion 122 is coated with a conductive grounded coating 130, which is electrically connected to a ground potential 140 via the ground sleeve 180 (see FIGS. 6 and 11). The gradual or tapered transition area 124 helps to avoid electrical stress between an area of high voltage potential (just above the transition area 124) to a ground potential 140 (just below the transition area). In this area 124, therefore, a very thin grounded conductive plating (explained in more detail below with reference to FIGS. 13A-13F), is initially applied on the entire dielectric member 104, and then the plating on the upper portion 120 is machined away so that the interface between dielectric and grounded plating tapers at a very gradual and slow rate of change, without any sharp or sudden edges or transitions. As seen in FIG. 11, where the ground sleeve 180 ends, above where the grounded coating 180 ends, a slight airgap above the ground sleeve 180 may be present between the ground sleeve 180 and the rubber insulator 21, which can be reduced or eliminated by conforming the insulator 21 to partially or completely fill such airgap. This reduces the chance that the lower dielectric air will create an area of electrical stress at this abrupt transition point from a relatively low dielectric (e.g., air) to a high dielectric (104).

The stress control apparatus 101 includes an electric field space 132 formed in the lower portion 122 adjacent to the channel 106. The voltage sensor 144 for sensing a voltage is positioned into the electric field space 132 formed between the conductive coating 108 and the conductive grounded coating 130. As will be explained in more detail below, the electric field space 132 is a space or cavity within the stress control apparatus 101 where an intentional electric field is created for the purpose of measuring a voltage (such as relative to ground 140) of the current carrying cable 12 by the voltage sensor 144 inserted into the electric field space 132. For example, the intentional electric field is created in a space between a conductive structure at a high voltage potential (e.g., corresponding to the potential of the current carrying cable 12) and another voltage potential, such as a grounded structure at a ground potential 140.

The term "stress control" as used herein is ascribed its meaning as understood by those of ordinary skill in the art of electrical distribution systems. For example, it refers to systems and methods of controlling or managing electrical stress, which otherwise could lead to partial discharge or dielectric breakdown. A dielectric refers to an electrically non-conductive structure or material.

By way of example, the dielectric member 104 can have an elongated cylindrical shape. Best seen in FIG. 6, the channel 106 extends lengthwise (along the longest dimension of the dielectric member 104) through the center of the dielectric member 104 thereby forming a central bore. For convenience, this channel 106 may be referred to herein as a central bore. The dielectric member 104 can assume other shapes. The cylindrical shape features no sharp edges or transitions (except at its ends) along a length of the dielectric member 104, including at the transition area 124, which aids in suppressing or eliminating electrical stress. The dielectric member 104 can be made of a polycarbonate material, for example, and can have a constant dielectric throughout its volume. For example, the dielectric member 104 can be made from a mold. Alternately, the dielectric member 104 can have dissimilar dielectric constants throughout its volume. For example, the dielectric constant of the dielectric material of the dielectric member 104 can be higher toward an outer surface thereof, but lower closer to the central bore 106, or vice versa.

Figure 9:
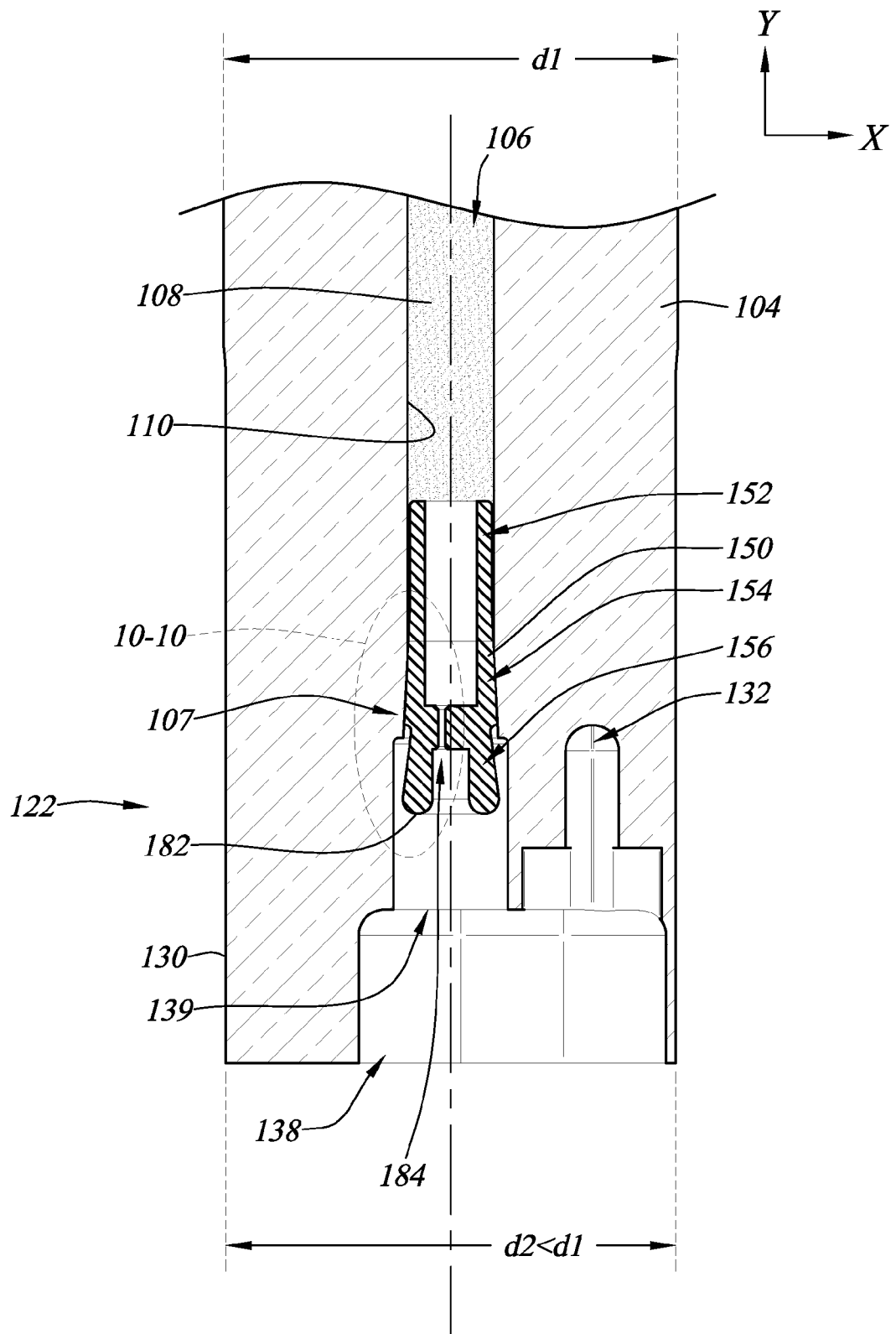
FIG. 9 is a partial side view of part of the stress control apparatus shown in FIG. 6, showing the conductive insert fully inserted into the channel adjacent to an electric field space. The area 10-10 is enlarged and shown in FIG. 10.

As shown in FIG. 9, the upper portion 120 of the dielectric member 104 has a diameter (d1) larger than a diameter (d2) of the lower portion 122 of the dielectric member 104. The lower portion 122 of the dielectric member 104 is electrically coupled to a ground potential 140 as shown in FIG. 6. The inner surface 110 of the channel 106 is electrically coupled to the current carrying cable 12 through the conductive coating or plating 191 of the threaded flange 190 to the flange 39 and to the hook 26 and curved portion 28 and finally to the current carrying cable 12 (all of which are conductive and electrically coupled to one another), which when energized has a high voltage potential relative to the ground potential 140. By way of example only, the diameter d1 can be 2.215 inches, whereas the diameter d2 can be 2.195 inches. Many other diameters are possible, but these are provided only as an example of how the difference in diameters is very slight, but enough to create a gradual taper in the transition area 124.

Figure 8B:
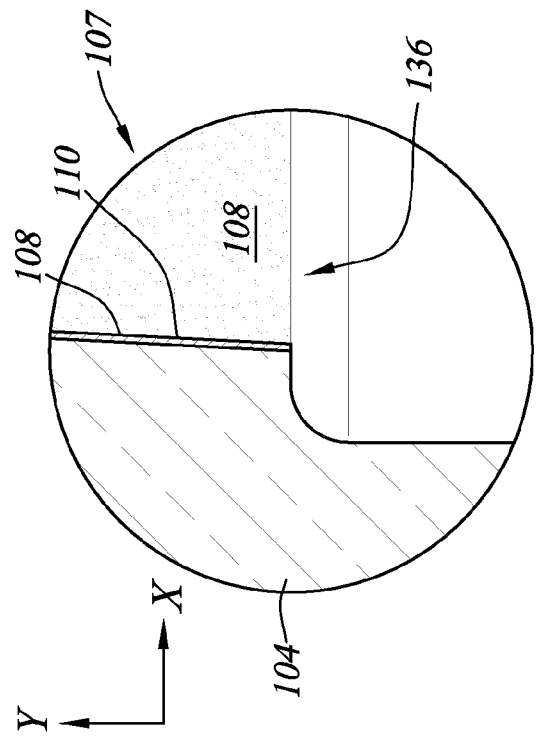
FIG. 8B is an enlarged view of a bottom end of the channel where it transitions to a terminating cavity, showing where the conductive coating on the channel ends shown in FIG. 7.
Figure 8C:
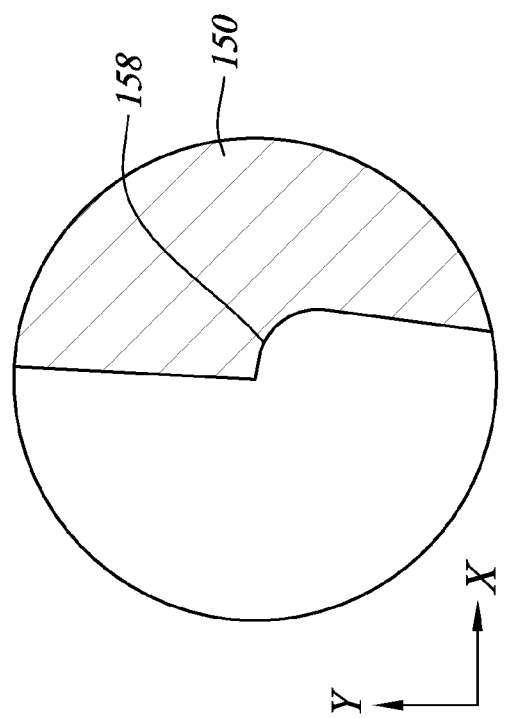
FIG. 8C is an enlarged view of a shoulder on the conductive insert shown in FIG. 7.
Figure 8A:
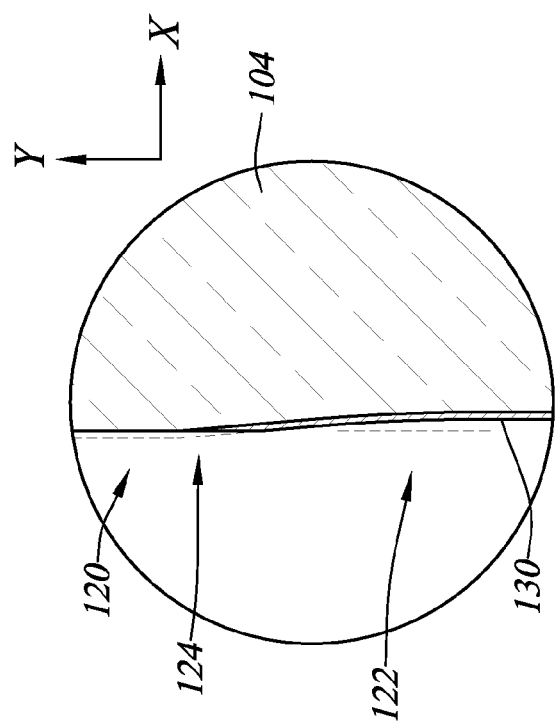
FIG. 8A is an enlarged side view of a tapered transition area on an outer surface of a dielectric member of the stress control apparatus of FIG. 7, showing how a grounded conductive coating gradually stops in the tapered transition area.
Figure 10:
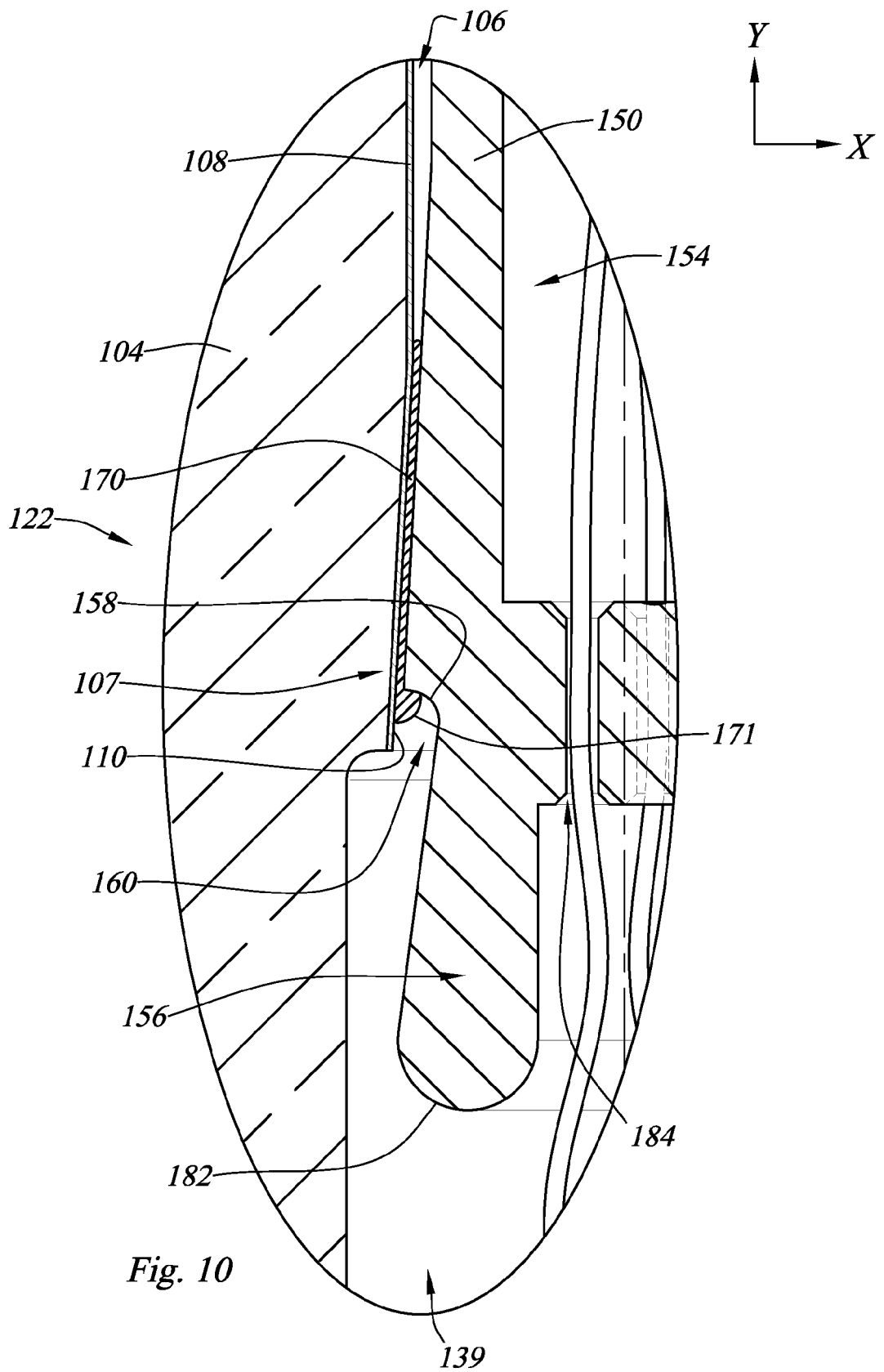
FIG. 10 is an enlarged view of the area 10-10 shown in FIG. 9, and shows a gap defined by the shoulder shown in FIG. 8C and the end of the conductive coating in the channel shown in FIG. 8B.

The stress control apparatus 101 can further include a conductive insert 150 (shown in FIG. 7) having an elongated section 152 including a tapered section 154 that tapers outwards toward a terminating section 156 such that a shoulder 158 (best seen in FIG. 8C) is formed between the elongated section 152 and the terminating section 156. The conductive insert 150 is inserted through a bottom opening 136 into the lower portion 107 of the channel 106 (FIGS. 7, 11) to electrically couple the conductive insert 150 to the coated inner surface 110 of the channel 106. Details of this arrangement are described below. The lower portion 107 of the channel 106 is tapered slightly outwards (relative to the elongated section 152) to follow the taper of the tapered section 154 of the conductive insert 150, as shown in FIG. 7. The small cross-sectional area of the insert 150 presents a high electrical stress, in volts per distance, in particular at its terminating section 156, and this stress is managed by providing a rounded end 182 at the end of the terminating section 156, as best seen in FIGS. 7, 9, and 10. The outer ground sleeve 180 presents another area of high electrical stress, and this area is managed by conforming the insulator 21 to eliminate or substantially eliminate any airgaps that form between the insulator 21 and the ground sleeve 180 as best seen in FIGS. 6 and 11.

Figure 12:
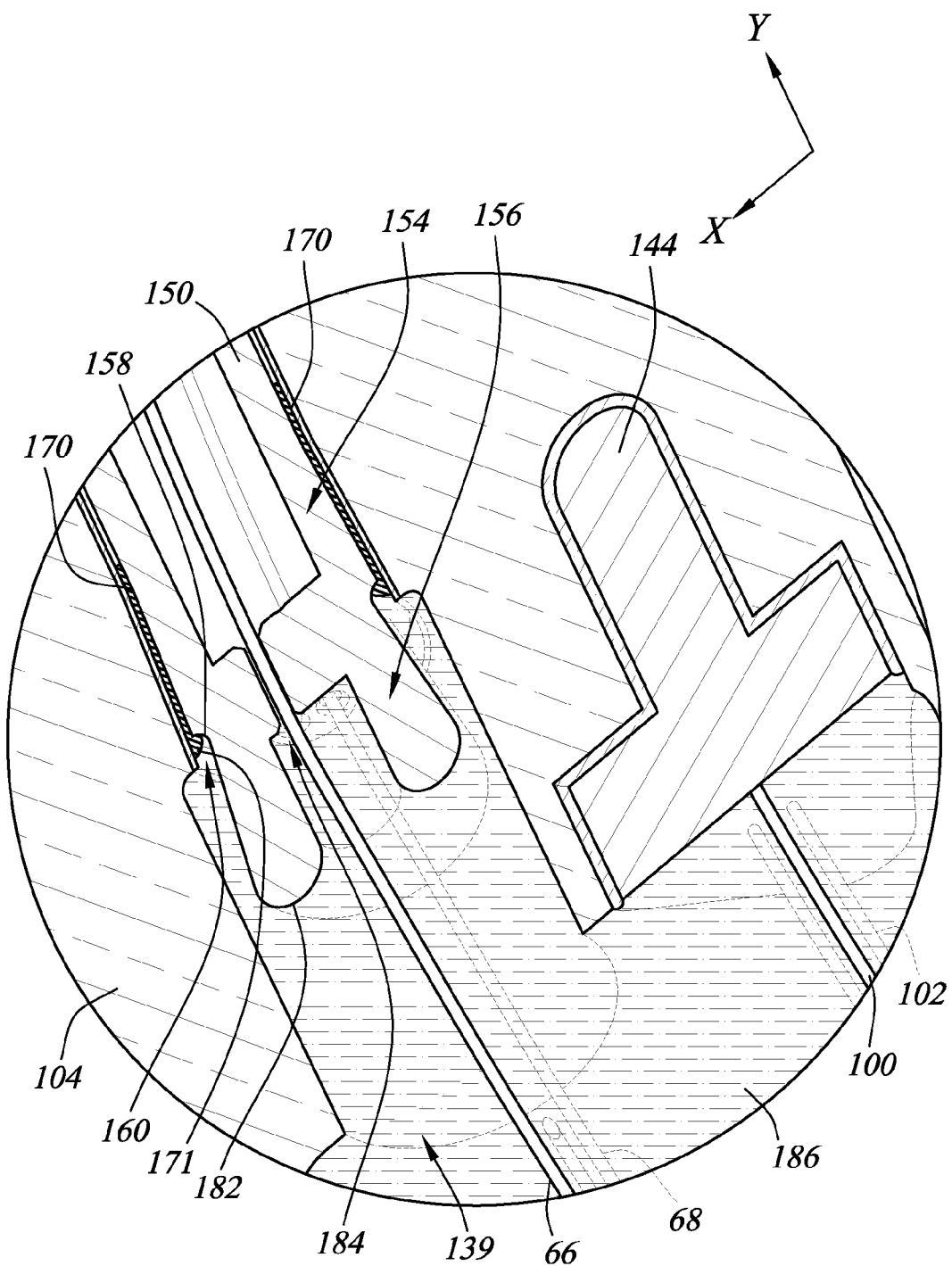
FIG. 12 is an enlarged view of the view shown in FIG. 11, showing an exaggerated amount of conductive adhesive between the conductive insert and the inner surface of the channel.

As can be seen in FIGS. 9, 11, and 12, the tapered section 154 of the conductive insert 150 is snugly wedged or pressed against the inner surface 110 of the channel 106 at the lower portion 107 of the channel 106 thereby forming a gap 160 (best seen in FIG. 10) leading to the bottom opening 136 of the channel 106 and defined by the shoulder 158 and the inner surface 110. The shoulder 158 and the coated inner surface 110 of the channel 106 are both at the same electric potential, which means that there is no risk of electrical stress occurring within the gap 160.

As mentioned above, and best seen in FIG. 7, the lower portion 107 of the channel 106 tapers outwards toward the bottom opening 136 of the channel 106 such that the lower portion 107 is coincident with the tapered section 154 of the conductive insert 150 when the conductive insert 150 is wedged against the inner surface 110 of the channel 106. FIG. 9 shows an area 10-10, which has been magnified in FIG. 10 to show the lower portion 107 of the channel 106, with the conductive insert 150 inserted into the bottom opening 136.

As shown in FIG. 10, a conductive epoxy or adhesive 170 is applied or disposed on or bonded to a portion of the elongated section 152 adjacent to the terminating section 156 such that at least a portion of the applied conductive adhesive 170 lies between the portion of the elongated section 152 and the coated inner surface 110 of the channel 106. As used herein, the material or substance 170, 171 can be a conductive epoxy or a conductive adhesive or any other electrically conductive material or substance that creates a mechanical and electrical bond between two electrically conductive surfaces, such as, for example, by heating, drying, evaporation, or chemical bonding. Note that in FIG. 10, the thicknesses of the adhesive 170 and the conductive plating or coating 110 of the channel 106 have been exaggerated for ease of illustration. Any excess 171 of the applied conductive adhesive 170, which may ooze or seep out into the gap 160 due to being squeezed between the elongated section 152 and the inner surface 110, collects in the gap 160 without extending beyond the bottom opening 136 of the channel 108. Below the bottom opening 136, as best seen in FIG. 11, there will be a potential difference created by the terminating section 156 and the grounded coating 130, so the gap 160 provides a place for any excess conductive material 171 to collect as it sets. FIG. 11 is a magnification of the area 11-11 shown in FIG. 6.

The terminating section 156 of the conductive insert 150 has a rounded end 182 (best seen in FIG. 10) that extends beyond inner surface 110 of the channel 106 when the conductive insert 150 is fully inserted through the bottom opening 136, as can be seen in FIGS. 10-12. The gently rounded or curved shape of the end 182 of the terminating section 156 avoids creating any sharp edges or transitions as the potential difference changes in a short distance from zero to a very high voltage, helping to manage or control electrical stress at the terminating section 156. The terminating section 156 of the conductive insert 150 includes one or more holes 184 configured to receive therethrough one or more corresponding optical fibers 66, 68 100, 102 running through the central bore 106 inside the dielectric member 104 and exiting out of the top opening 135. The holes 184 are coincident with the channel 106 when the conductive insert 150 is inserted therein. The conductive insert 150 can be a unitary piece of molded or cast metal, or it can be composed of separate components arranged together to form an integral piece. The term "insert," means that the device is not an integral part of the dielectric member 140 until it is adhered, such as by a conductive adhesive 170, or press-fit or otherwise coupled to the channel 108. In other words, the insert 150 is a standalone piece or component that is coupled to the dielectric member 104 through the channel 106 in any manner disclosed herein.

The dielectric member 104 includes a terminating cavity 139 that receives the terminating section 156 of the conductive insert 150, as shown in FIGS. 10-12. The electric field in the terminating cavity 139 is very strong, particularly where the terminating section 156 is located, so all exposed conductive surfaces in this terminating cavity 139 are gentle and smooth. A potting material 186, such as a dielectric epoxy or an epoxy-based polyurethane, for example, fills the terminating cavity 139 and the bottom cavity 138 after the voltage sensor 144 and optical fibers 66, 68, 100, 102 have been installed into the base assembly 102a. The potting material 186 is best seen in FIGS. 11 and 12. The fusable-like inner surface 110 of the channel 106, coupled with the small size of the conductive insert 150, manages electrical stress by eliminating a path for current through the stress control apparatus 101 during an electrical fault.

Figure 13A:
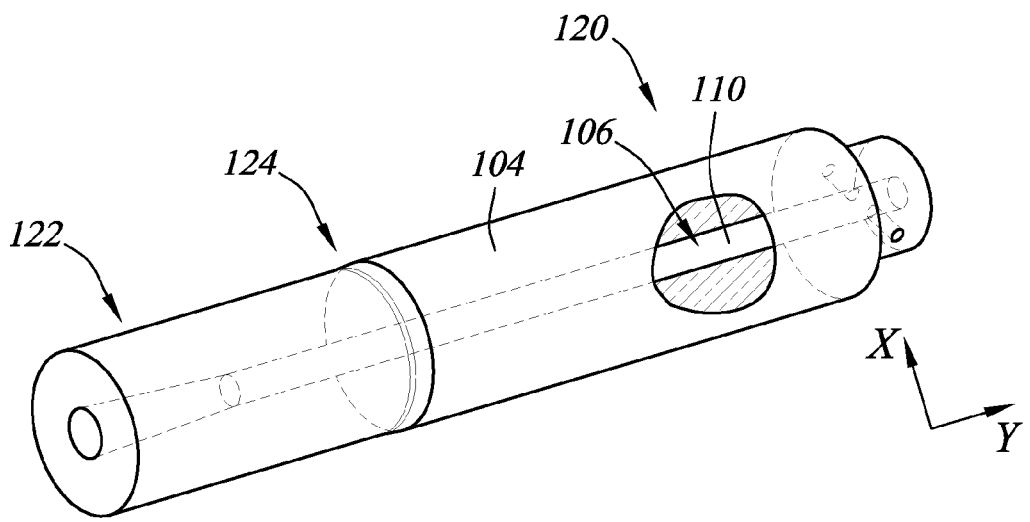
FIGS. 13A-13F illustrate example sequences of a method of making a stress control apparatus, such as the one shown in FIGS. 5-12.
Figure 13B:
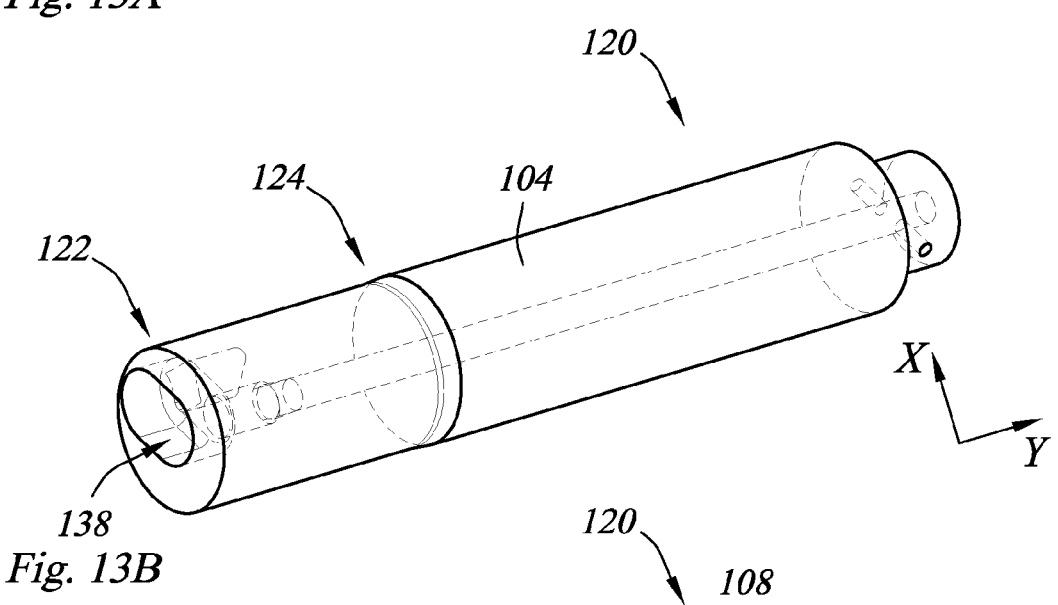

A method of forming a stress control apparatus, such as the apparatus 101 shown and described in this disclosure, is discussed in connection with FIGS. 13A-13F. In FIG. 13A, an elongated dielectric member 104 is provided. The dielectric member 104 has an upper portion 120 that transitions to a lower portion 122 at a transition area 124, and the lower portion 122 has a smaller overall cross section than that of the upper section 120 at the transition area 124. The transition area 124 has a smooth taper bereft of any sharp edges as discussed above to minimize or eliminate any airgaps between the transition area 124 and an outer rubber insulator sleeve 21. A channel 106 is formed that extends lengthwise through the dielectric member 104. As noted above, the dielectric member can be formed by a fabrication or casting process, for example, and can be composed of a polycarbonate material. In FIG. 13B, the dielectric member 104 is shown with the bottom cavity 138 formed in the lower portion 122 of the dielectric member 104. The dielectric member 104 also includes the terminating cavity 139, and the electric field space 132, all of which are not yet coated. At this stage of the process shown in FIG. 13B, the entire dielectric member 104 is still 100% dielectric, e.g., polycarbonate.

Figure 13C:
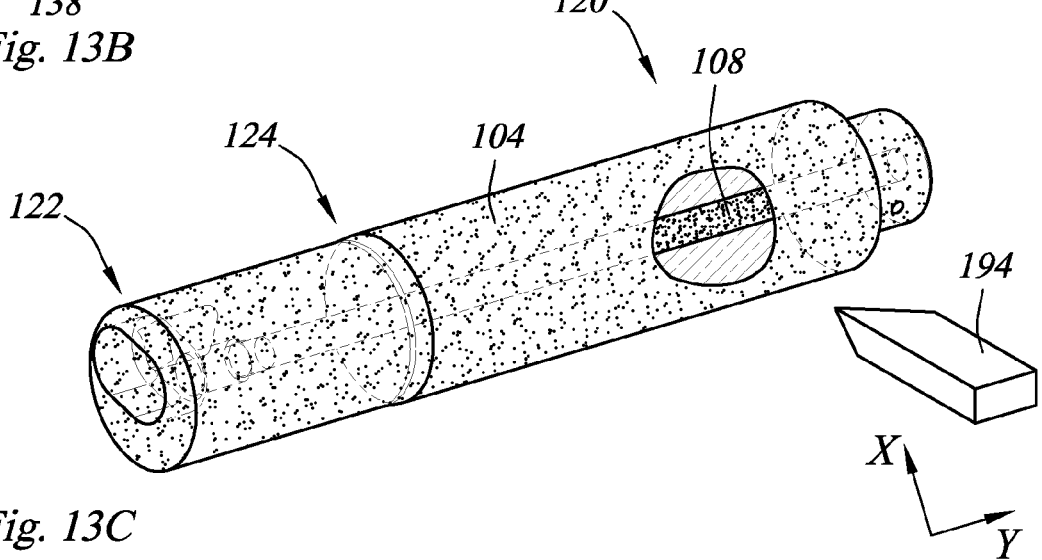

In FIG. 13C, the entire dielectric member 104 is plated or coated with a conductive plating or coating (plating and coating are synonymous herein). This process completely coats or plates the channel 106 with the conductive coating 108. This conductive coating 108 eventually carries the high voltage potential from the cable 12 down the length of the dielectric 104. Many techniques are known for applying the conductive coating on every exposed surface of the dielectric member 104.

Figure 13D:
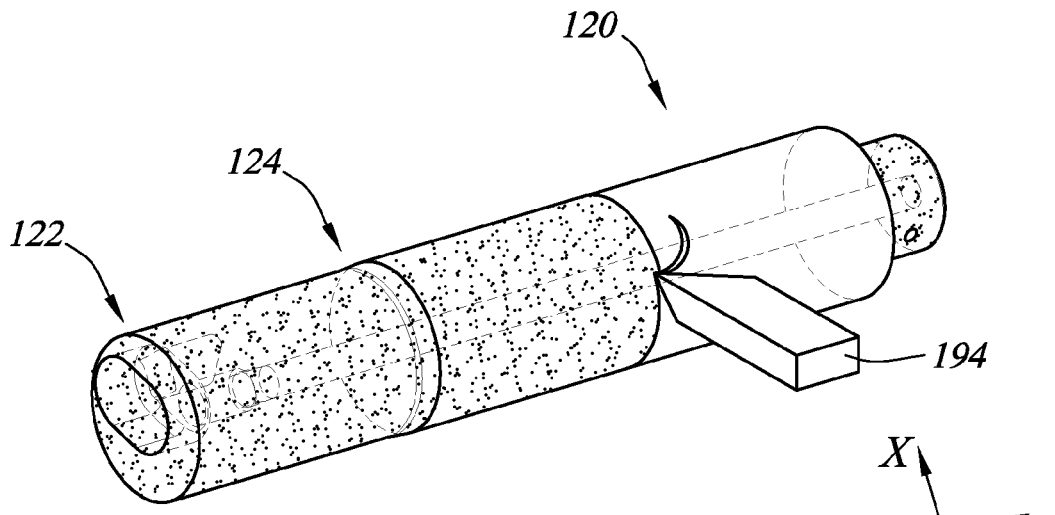
Figure 13E:
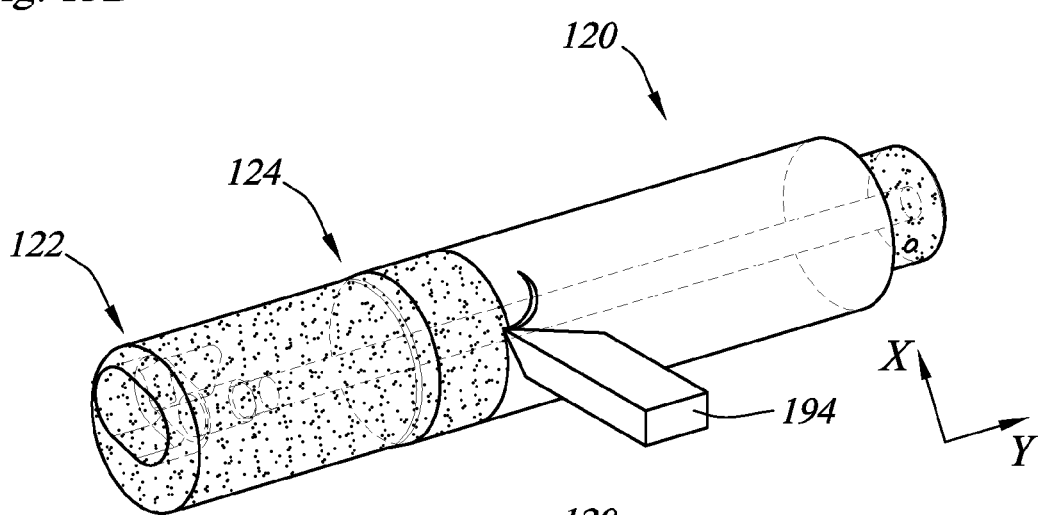

In FIGS. 13D and 13E, the conductive coating is removed on the dielectric member 104 from the upper portion 120 while retaining the conductive coating on the lower portion 122. These areas can be removed by machining, using a machining tool 194, for example, such as a lathe. The conductive coating 108 inside the channel 106 remains intact. The conducting coating on the threaded flange 190 also remains intact.

Figure 13F:
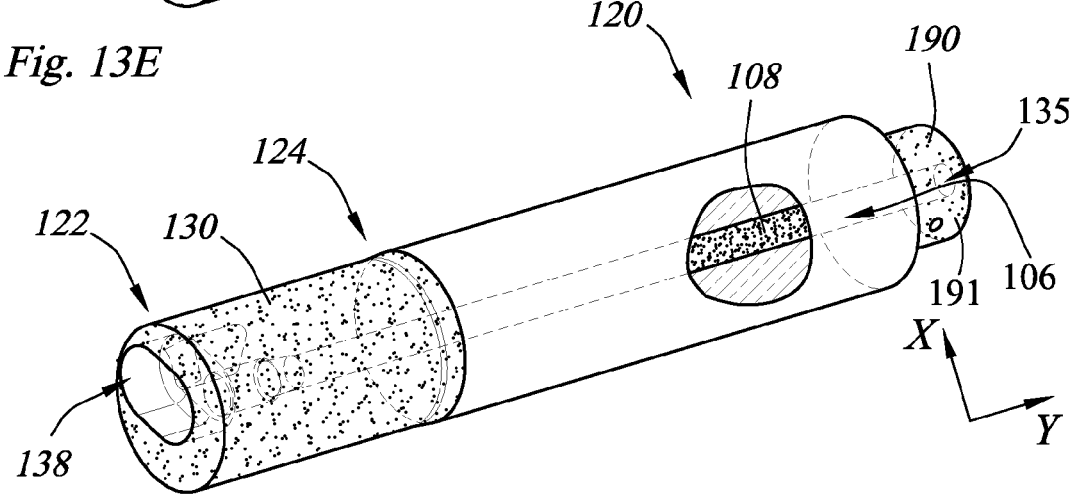

Finally, in FIG. 13F, the conductive coating is removed from the dielectric member 104 such that no electrical connection exists between the conductive coating 108 on the inner surface 110 of the channel 106 and the conductive coating that remains on the lower portion 122 of the dielectric member 104. For example, the coating surrounding the cavities 138, 139, and the electric field space 132 is machined away by the bottom cavity 138, for example, an electrical discontinuity is created between the remaining conductive grounded coating 130 on the outer surface of the lower portion 122 of the dielectric member 104, and the inner surface 110 of the channel 106, which will eventually be connected to a very high voltage potential.

As explained above, the upper portion 120 has a slightly wider diameter (or slightly larger cross section) than that of the lower portion 122, so the conductive coating on the upper portion 120 can be machined away by a machining tool 194 positioned to machine away only the conductive coating on the upper portion 120 because the coating 130 that remains on the lower portion 122 is protected from being machined away due to its smaller diameter (or cross section). The tapered transition area 124 thus serves not only to provide a smooth, gradual transition from an area of high potential to ground potential, but also to speed up the machining process, which is aided by the tapered transition area 124 when machining away the coating from the upper portion 120.

A thin layer of a conductive epoxy or conductive adhesive 170 or any other electrically conductive material or substance that creates a mechanical and electrical bond between the tapered section 154 and the channel 106 is applied around the tapered section 154 of the conductive insert 150. The conductive insert 150 is inserted (elongated end 152 first) into the channel 106 through the bottom opening 136 thereof, and then can be twisted or rotated slightly or press-fit to ensure a snug connection or seating of the conductive insert 150 in the channel while the adhesive 170 cures or sets (e.g., by heating or setting or drying or evaporation). Once cured, such as shown in FIG. 10, any excess adhesive or material that seeps or oozes out will collect in the gap 160, which has no potential difference and therefore no electric field therein. Thus, it does not matter what form or shape the excess adhesive 170 takes, as long as it remains within the gap 160. The voltage sensor 144 is inserted into the electric field space 132, and the optical fibers 66, 68 can be routed through the one or more holes 184 to the optical current sensor 40, and all of the optical fibers 66, 68, 100, 102, exit the base unit 20 through the pass-through connector 81 at the very bottom of the base unit 20 for connection to the electronic system 71.

According to another method, the conductive areas on the stress control apparatus 101 can be selectively plated or masked using a selective plating or a selective painting or a masking technique, which causes only the desired conductive areas of the dielectric member 104 to be plated or coated with a conductive material while leaving the dielectric areas untouched. This process, for example, can be applied to form the grounded coating 130 and the conductive coating or plating 191 on the threaded flange 190 and the conductive coating or plating 108.

As used in this application, the words "a," "an," and "one" are defined to include one or more of the referenced item unless specifically stated otherwise. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application.

While particular embodiments and applications of the present disclosure have been illustrated and described, it is to be understood that the disclosure is not limited to the precise construction and compositions disclosed herein and that various modifications, changes, and variations can be apparent from the foregoing descriptions without departing from the spirit and scope of the invention as defined in the appended claims.

What is claimed is:

1. A stress control apparatus, comprising:
    a base assembly having an elongated dielectric member, a channel extending lengthwise through the dielectric member, an electrically conductive coating completely covering an inner surface of the channel and connected to a high voltage potential, the dielectric member having an upper portion that transitions to a lower portion at a transition area, wherein the lower portion has a smaller overall cross section than the upper portion at the transition area, and wherein the upper portion transitions to the lower portion in the transition area along a smooth taper devoid of sharp edges;
    a conductive grounded coating on the lower portion connected to a ground potential; and
    an electric field space formed in the lower portion adjacent to the channel and configured to receive therein a voltage sensor for sensing a voltage between the conductive coating and the conductive grounded coating.

2. The stress control apparatus of claim 1, wherein the dielectric member has a cylindrical shape, the channel extending through the center of the dielectric member thereby forming a central bore, wherein the upper portion of the dielectric member has a diameter larger than a diameter of the lower portion of the dielectric member.

3. The stress control apparatus of claim 1, wherein the lower portion of the dielectric member is electrically coupled to a ground potential, and the inner surface of the channel is electrically coupled to a cable having a high voltage potential.

4. The stress control apparatus of claim 1, further comprising:
    a conductive insert having an elongated section including a tapered section that tapers outwards toward a terminating section such that a shoulder is formed between the elongated section and the terminating section, the conductive insert being inserted through a bottom opening of the channel to electrically couple the conductive insert to the inner surface of the channel.

5. The stress control apparatus of claim 4, wherein the tapered section of the conductive insert is wedged against the inner surface of the channel at a lower portion of the channel thereby forming a gap leading to the bottom opening of the channel and defined by the shoulder and the inner surface.

6. The stress control apparatus of claim 5, wherein the shoulder and the inner surface are both at the same electric potential.

7. The stress control apparatus of claim 5, wherein the lower portion of the channel tapers outwards toward the bottom opening of the channel such that the lower portion is coincident with the tapered section of the conductive insert when the conductive insert is wedged against the inner surface of the channel.

8. A method of forming a stress control apparatus, comprising:
    providing an elongated dielectric member having an upper portion that transitions to a lower portion at a transition area, the lower portion having a smaller overall cross section than the upper section at the transition area, the transition area including a smooth taper bereft of any sharp edges;
    forming a channel extending lengthwise through the dielectric member;
    coating an inner surface of the channel completely with an electrically conductive coating;
    coating an outer surface of the dielectric member with the conductive coating;
    removing the conductive coating on the dielectric member from the upper portion while retaining the conductive coating on the lower portion of the dielectric member; and removing the conductive coating from the dielectric member such that no electrical connection exists between the conductive coating on the inner surface and the conductive coating that remains on the lower portion of the dielectric member.

9. The method of claim 8, wherein the removing is carried out by machining away the electrically conductive coating from the upper section where the coating on the lower portion is protected from being machined away due to the smaller overall cross section.

10. The method of claim 8, wherein the lower portion of the dielectric member is configured to be electrically coupled to a ground potential, and the inner surface of the channel is configured to be electrically coupled to a high voltage potential associated with a current carrying cable to which the stress control apparatus is coupled.

11. The method of claim 10, wherein the elongated dielectric member includes an electric field space in the lower portion, the electric field space being configured to receive therein a voltage sensor configured to measure a voltage between the high voltage potential and the ground potential.

12. A stress control apparatus, comprising:
a base assembly having an elongated dielectric member, a conductive channel extending lengthwise through the dielectric member, the channel having a top opening and a bottom opening; and
a conductive insert having an elongated section that flares outwards toward a terminating section such that a shoulder is formed between the elongated section and the terminating section, the conductive insert being inserted through the bottom opening to electrically couple to the inner surface of the channel.

13. The stress control apparatus of claim 12, wherein the flared out elongated section is wedged against the inner surface of the channel thereby forming a gap leading to the bottom opening and defined by the shoulder and the inner surface, and wherein the shoulder and the inner surface are both at the same electric potential.

14. The stress control apparatus of claim 13, further comprising a conductive material on a portion of the elongated section adjacent to the terminating section such that at least a portion of the applied conductive material lies between the portion of the elongated section and the inner surface of the channel, wherein any excess of the applied conductive material collects in the gap without extending beyond the bottom opening of the channel.

15. The stress control apparatus of claim 13, wherein the conductive material is an adhesive, an epoxy, or a thermoset adhesive.

16. The stress control apparatus of claim 12, wherein the terminating section of the conductive insert has a rounded end, the rounded end extending beyond inner surface of the channel when the conductive insert is inserted through the bottom opening.

17. The stress control apparatus of claim 12, wherein the terminating section of the conductive insert includes one or more holes configured to receive therethrough one or more corresponding optical fibers extending inside the channel and exiting out of the top opening.

18. The stress control apparatus of claim 12, further comprising an electric field space formed in a lower portion of the dielectric member and adjacent to the terminating section of the conductive insert, the electric field space being configured to receive therein a voltage sensor for sensing a voltage between the conductive insert and the conductive grounded coating, the conductive insert being electrically coupled via the electrically conductive coating on the inner surface of the channel to a conductor carrying electrical current.

19. The stress control apparatus of claim 12, wherein the dielectric member further includes a terminating channel that receives the terminating section of the conductive insert, the apparatus further comprising a potting material that fills the terminating channel.

* * * * *